(12) United States Patent
Tomita

(10) Patent No.: US 7,125,754 B2
(45) Date of Patent: Oct. 24, 2006

(54) SEMICONDUCTOR DEVICE AND ITS MANUFACTURING METHOD

(75) Inventor: Masaaki Tomita, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 209 days.

(21) Appl. No.: 10/311,312

(22) PCT Filed: May 8, 2002

(86) PCT No.: PCT/JP02/04480

§ 371 (c)(1),
(2), (4) Date: Dec. 27, 2002

(87) PCT Pub. No.: WO02/091474

PCT Pub. Date: Nov. 14, 2002

(65) Prior Publication Data

US 2003/0107049 A1    Jun. 12, 2003

(30) Foreign Application Priority Data

May 9, 2001    (JP) .............................. 2001-138058

(51) Int. Cl.
*H01L 29/74* (2006.01)
*H01L 23/48* (2006.01)

(52) U.S. Cl. ...................... 438/138; 438/772; 438/779; 438/E23.079

(58) Field of Classification Search ................ 257/107, 257/138, 139, 147, 686, 779, 784, E23.079, 257/689, 772, 180, 152, E23.026
See application file for complete search history.

(56) References Cited

U.S. PATENT DOCUMENTS 4,574,209 A    3/1986 Lade et al.

(Continued)

FOREIGN PATENT DOCUMENTS

EP    0590804    4/1994

(Continued)

OTHER PUBLICATIONS

English Language Abstract of JP 11-158448.

(Continued)

*Primary Examiner*—Michael Lebentritt
*Assistant Examiner*—Ron Pompey
(74) *Attorney, Agent, or Firm*—Greenblum & Bernstein, P.L.C.

(57) ABSTRACT

The present invention has an object of providing a thyristor-type semiconductor device and a manufacturing method for the same which can prevent, even when conventional manufacturing equipment is used, the electrode terminals 13, 14 from being provided in a significantly tilted state where the electrode terminals 13, 14 are in contact with the silicon substrate 20, and can also prevent the electrode terminals 13, 14 from being provided in a state where the electrode terminals 13, 14 come into contact with the silicon substrate 20, even when there are warping and undulations in the silicon substrate 20. In a semiconductor device of the present invention, the supports 11a, 11b are provided on both surfaces of the silicon substrate 20 using a glass material. When doing so, the support 11b is disposed in a part of the boundary between the second N-type layer 18 and the second P-type layer 19 that is opposite the side surface 22. With this structure, even if the electrode terminals 13, 14 are tilted when the electrode terminals 13, 14 are provided, the supports 11a, 11b support the electrode terminals 13, 14 from below, so that the electrode terminals 13, 14 can be prevented from being provided in contact with the silicon substrate 20. Also, even when there are warping and undulations in the silicon substrate 20, the electrode terminals 13, 14 can be prevented from being provided in contact with the silicon substrate 20.

28 Claims, 25 Drawing Sheets

U.S. PATENT DOCUMENTS

| | | | |
|---|---|---|---|
| 4,746,625 A | | 5/1988 | Morita et al. |
| 5,295,044 A | * | 3/1994 | Araki et al. ................. 361/709 |
| 5,319,222 A | * | 6/1994 | Shekar et al. ............... 257/138 |
| 5,422,289 A | * | 6/1995 | Pierce ......................... 438/297 |
| 5,455,448 A | | 10/1995 | Benjamin |
| 5,471,089 A | * | 11/1995 | Nagatomo et al. ........... 257/691 |
| 5,544,412 A | * | 8/1996 | Romero et al. ............... 29/832 |
| 5,781,392 A | * | 7/1998 | Clark .......................... 361/111 |
| 5,796,123 A | | 8/1998 | Salbreux |
| 6,372,659 B1 | * | 4/2002 | Yu ............................... 438/766 |
| 6,404,566 B1 | | 6/2002 | Andersen et al. |
| 6,437,449 B1 | * | 8/2002 | Foster ......................... 257/777 |
| 6,740,811 B1 | * | 5/2004 | Kurita ......................... 174/52.1 |
| 6,819,095 B1 | * | 11/2004 | Dubhashi et al. ........ 324/117 H |

FOREIGN PATENT DOCUMENTS

| | | |
|---|---|---|
| EP | 1143519 | 10/2001 |
| JP | 5-267362 | 10/1993 |
| JP | 5-343658 | 12/1993 |
| JP | 10163230 | 6/1998 |
| JP | 11158448 | 6/1999 |

OTHER PUBLICATIONS

English Language Abstract of JP 10-163230.
English Language Abstract of JP 5-343658.
English Language Abstract of JP 5-267362.

* cited by examiner (a)

(b)

(a)

(b)

(a)

(b)

(a)

(b)

(a)

(b)

SEMICONDUCTOR DEVICE AND ITS MANUFACTURING METHOD

TECHNICAL FIELD

The present invention relates to a semiconductor device and a method of manufacturing the same. In particular, the present invention relates to a thyristor-type semiconductor device that is used in a power-supply circuit or the like and to a method of manufacturing the same.

RELATED ART

FIGS. 26(a) and 26(b) are cross-sectional views showing a thyristor-type semiconductor device according to the related art, with FIG. 26(a) being a cross-sectional view of a thyristor-type semiconductor device in which electrode terminals have been correctly provided and FIG. 26(b) being a cross-sectional view of a thyristor-type semiconductor device in which one of the electrode terminals has been provided in a state where it is in contact with a silicon substrate. In these drawings, reference numeral 910 designates the semiconductor device, reference numerals 912a, 912b, 912c designate solder, reference numeral 913 designates a cathode terminal, reference numerals 914, 921 designate anode terminals, reference numerals 915a to 915d designate insulating films, reference numeral 916 designates a first N-type layer, reference numeral 917 designates a first P-type layer, reference numeral 918 designates a second N-type layer, reference numeral 919 designates a second P-type layer, and reference numeral 920 designates the silicon substrate.

As shown in FIG. 26(a), the semiconductor device 910 is formed with the first N-type layer 916, the first P-type layer 917, the second N-type layer 918, and the second P-type layer 919 being provided on top of one another within the silicon substrate 920. In particular, the second P-type layer 919 is formed inside the second N-type layer 918. The cathode terminal 913 is provided on the surface of the silicon substrate 920 on the same side as the first N-type layer 916, with the cathode terminal 913 being connected to the first N-type layer 916 by the solder 912a. In the same way, the anode terminal 914 is provided on the surface of the silicon substrate 920 on the same side as the second N-type layer 918 and the second P-type layer 919, with the anode terminal 914 being connected to the second N-type layer 918 and the second P-type layer 919 by the solder 912b.

In the silicon substrate 920, insulating films 915a, 915c and insulating films 915b and 915d, which are each formed of a glass material, are respectively provided at the boundary between the first N-type layer 916 and the first P-type layer 917 and in the periphery of this boundary and at the boundary between the second N-type layer 918 and the first P-type layer 917 and in the periphery of this boundary. The first P-type layer 917 is also connected to a gate electrode (not shown in the drawings). It should be noted that certain types of thyristor have a structure that does not include a gate electrode.

With the above structure, when a negative potential is applied to the cathode terminal 913 and a positive potential is applied to the anode terminal 914 and a positive potential of a predetermined threshold or higher is simultaneously applied to the (not illustrated) gate electrode, positive holes and electrons are exchanged between the first N-type layer 916, the first P-type layer 917, the second N-type layer 918, and the second P-type layer 919, and a current flows between the cathode terminal 913 and the anode terminal 914.

The following is an overview of the procedure for providing the cathode terminal 913 and the anode terminal 914 on the silicon substrate 920. First, the solder 912a is printed on one surface of the silicon substrate 920 and the solder 912b is printed on the other surface of the silicon substrate 920. Next, the cathode terminal 913 is mounted on the solder 912a and the anode terminal 914 is mounted on the solder 912b. After this, the silicon substrate 920 is placed in a reflow furnace and the solder 912a and the solder 912b are melted to respectively attach the cathode terminal 913 and the anode terminal 914.

There are cases, however, where during the mounting of the cathode terminal 913 and the anode terminal 914 on the solder 912a, 912b, one or both of the electrode terminals is mounted in a position that is displaced in one direction or the other. If the solder 912a, 912b is melted in the reflow furnace with one or both electrode terminals in a displaced state, as shown in FIG. 26(b) for example, the anode terminal 921 may be tilted and may be attached by the solder 912b, 912c in this tilted state.

If the cathode terminal 913 or the anode terminal 914 is in contact with the silicon substrate 920 in a tilted state, there are problems such as the flow of the electrical current becoming unbalanced. When the semiconductor device 910 is mounted on a circuit board or the like, bad connections may occur between the tilted electrode terminal and the circuit board or the like. This type of problem can be remedied by accurately mounting the cathode terminal 913 and the anode terminal 914 on the solder 912a, 912b, though costly manufacturing equipment is required to do so, which pushes up the manufacturing cost of semiconductor devices.

When the semiconductor device 910 is a large-sized semiconductor device that handles a large current, due to the effects of warping and undulations in the silicon substrate 920, there are cases where the cathode terminal 913 or the anode terminal 914 comes into contact with the silicon substrate 920. In such cases also, problems occur, such as the flow of electrical current becoming unbalanced. When the semiconductor device 910 is mounted onto a circuit board or the like, this can also cause bad connections between the tilted electrode terminal and the circuit board or the like.

In order to solve the stated problems, it is an object of the present invention to provide a thyristor-type semiconductor device and a manufacturing method for the same where during the mounting of the electrode terminals 913, 914 on the silicon substrate 920, the electrode terminals 913, 914 can be prevented from being provided in a significantly tilted state where the electrode terminals 913, 914 are in contact with the silicon substrate 920, even when conventional manufacturing equipment is used, the electrode terminals 913, 914 also being prevented from being provided in a state where the electrode terminals 913, 914 contact the silicon substrate 920, even when there are warping and undulations in the silicon substrate 920.

DISCLOSURE OF THE INVENTION

In order to achieve the stated object, a semiconductor device of the present invention includes: a first conductive region of a first type of conductivity that is formed so as to be exposed to a first surface of a semiconductor substrate; a second conductive region of a second type of conductivity, which is an inverse of the first type of conductivity, that is formed so as to be exposed to the first surface of the semiconductor substrate; a conductive material that is provided on the first conductive region and the second conductive region; an electrode terminal that is provided on the conductive material; and a support that projects from the first surface at a position at or near a boundary between the first conductive region and the second conductive region where the conductive material is provided.

Accordingly, with the semiconductor device of the present invention, even if the electrode terminal is displaced and tilted when the electrode terminal is provided on the conductive material, the support positioned below the electrode terminal supports the electrode terminal, so that the tilting of the electrode terminal can be suppressed to within a predetermined range. Even when there are warping and undulations in the silicon substrate, the electrode terminal can be prevented from being provided in contact with the silicon substrate.

In addition, an insulating film may be provided at or near an edge of the first conductive region, with the support being formed so that a top end of the support is positioned above a top end of the insulating film but below a top end of the conductive material. By doing so, the support can be prevented from projecting out of the conductive material and obstructing the attachment of the conductive material to the electrode terminal. Even when the electrode terminal is tilted or there are warping and undulations in the silicon substrate, it is possible to reliably prevent the support from not reaching the electrode terminal and the electrode terminal from being provided in contact with the first conductive region or the second conductive region.

The support should preferably be made of a glass material. When doing so, unlike a silicon oxide layer that is limited to being formed as a layer that is 2 or 3 μm high, a support that is 10 μm or higher can be easily formed.

The support can be made with a multilayer structure composed of a layer of a glass material and a film of the same material as the insulating film. In this case, the support has a structure that is resistant to thermal stress.

The support can also be made with a multilayer structure composed of a film of adhesive and a layer of a glass material. By doing so, it becomes easy to produce a support on a semiconductor device with a relatively large area.

The support can also be made of the same material as the insulating film. By doing so, the support can be manufactured by the same process as the insulating film, so that a separate process is not required for producing the support.

It is preferable for the support to be at least 10 μm thick and more preferable for the support to be at least 20 μm thick. By doing so, when the electrode terminal is provided on the conductive material, even if the electrode terminal is displaced and tilted, the support positioned below the electrode terminal reliably supports the electrode terminal, so that the tilting of the electrode terminal can be suppressed to within a predetermined range. Even when there are relatively large warping and undulations in the silicon substrate, the electrode terminal can be prevented from being provided in contact with the silicon substrate.

The second conductive region may be formed in an off-center position that is displaced towards one edge of the first conductive region, and the support may be formed at or near the boundary on an opposite side to the edge towards which the second conductive region is formed. By doing so, since little current flows on the opposite side to the side towards which the second conductive region is displaced, the obstruction of the flow of current by the support can be very effectively suppressed.

A plurality of second conductive regions may be formed inside the first conductive region, and the support may be provided in or near a region that faces the plurality of second conductive regions. By doing so, since little current flows in the region that faces the plurality of second conductive regions, the obstruction of the flow of current by the support can be very effectively suppressed.

It is preferable for the supports to be in the form of cylinders. By doing so, the creation of voids during the reflow process can be effectively suppressed.

The second conductive region may be formed in a central part of the first conductive region, and a plurality of supports may be provided in a periphery of the second conductive region. By doing so, since little current flows in a periphery of the second conductive region, the obstruction of the flow of current by the supports can be very effectively suppressed.

The semiconductor device may further include a region for providing a gate potential inside the first conductive region, with the support being provided at or near a region where the region for providing the gate potential and the second conductive region face one another. In this case, since little current flows in a region where the region for providing the gate potential and the second conductive region face one another, the obstruction of the flow of current by the support can be very effectively suppressed.

The semiconductor device of the present invention may further include another conductive material that is provided on a second surface of the semiconductor substrate, another support that projects from the second surface, and another electrode terminal that is provided on the other conductive material.

In this case, the semiconductor device may further include a third conductive region of the first type of conductivity that is exposed to the second surface, another conductive material that is provided on the third conductive region, another support that projects from the third conductive region on the second surface, and another electrode terminal that is provided on the conductive material.

The semiconductor device may include a third conductive region of the first type of conductivity that is exposed to the second surface, a fourth conductive region of the second type of conductivity, which is an inverse of the first type of conductivity, that is formed inside the third conductive region and is exposed to the second surface, another conductive material that is provided on the third conductive region and the fourth conductive region, a support that projects from the second surface at a position at or near a boundary between the third conductive region and the fourth conductive region where the other conductive material is provided, and another electrode terminal that is provided on the other conductive material.

By doing so, in a semiconductor device, such as a bidirectional thyristor, that has an electrode terminal provided on a second surface, even if the other electrode terminal is displaced and tilted, the support provided below the other electrode terminal supports the other electrode terminal, so that the tilting of the other electrode terminal can be suppressed to within a predetermined range. Even if there are warping and undulations in the silicon substrate, the other electrode terminal can be prevented from being provided in contact with the silicon substrate.

Another aspect of the present invention is a semiconductor device including: a first conductive region of a first type of conductivity that is formed so as to be exposed to a first surface of a semiconductor substrate; a second conductive region of a second type of conductivity, which is an inverse of the first type of conductivity, that is formed so as to be exposed to the first surface of the semiconductor substrate; a conductive material that is provided on the first conductive region and the second conductive region; an electrode terminal that is provided on the conductive material; and a support that projects from a surface of the electrode terminal at a position that is opposite a position at or near a boundary between the first conductive region and the second conductive region.

In this semiconductor device according to the present invention, when the electrode terminal is provided on the conductive material, even if the electrode terminal is displaced and tilted, the support provided on the electrode terminal contacts a surface on which the first conductive region and the second conductive region of the semiconductor device are provided, so that the electrode terminal can be prevented from tilting by a predetermined amount or more. Even if there are warping and undulations in the silicon substrate, the electrode terminal can be prevented from being provided in contact with the silicon substrate.

Another aspect of the present invention is a semiconductor device, including: a plurality of regions that are electrically isolated from one another on one surface of a semiconductor substrate; and a support that projects from the surface on an element isolating region for electrically isolating the plurality of regions.

With the above structure, when the electrode terminal is connected to a conductive region of the semiconductor substrate via the conductive material, even if the electrode terminal is displaced and tilted, the support positioned below the electrode terminal supports the electrode terminal, so that the tilting of the electrode terminal can be suppressed to within a predetermined range. Even if there are warping and undulations in the semiconductor substrate, the electrode terminal can be effectively prevented from being provided in contact with the silicon substrate. Since little current flows in the element isolating region, the obstruction of the flow of current by the support can be very effectively suppressed.

Another aspect of the present invention is a power control semiconductor device in which an insulated gate transistor that performs switching for a current flowing in a thickness direction of a semiconductor substrate is formed on one surface of the semiconductor substrate, the semiconductor device including: a first support that is provided on a gate electrode of the insulated gate transistor via an insulating film; and a second support that is formed on a well which composes the insulated gate transistor.

With the above structure, when the electrode terminal is connected to a conductive region of the semiconductor substrate via the conductive material, even if the electrode terminal is displaced and tilted, the supports positioned below the electrode terminal support the electrode terminal, so that the tilting of the electrode terminal can be suppressed to within a predetermined range. Even if there are warping and undulations in the semiconductor substrate, the electrode terminal can be effectively prevented from being provided in contact with the silicon substrate. Since little current flows in an insulated gate transistor, the obstruction of the flow of current by the support can be very effectively suppressed. Also, since the well which composes an insulated gate transistor has a relatively large area, by forming the support in a part of the well where little current flows, the obstruction of the flow of current by the support can be very effectively suppressed.

Another aspect of the present invention is a power control semiconductor device, including: a printed circuit board; a semiconductor substrate that is disposed on the printed circuit board; and a metal electrode that is disposed on the semiconductor substrate, wherein a first conductive region formed on a first surface of the semiconductor substrate is connected to a surface of the printed circuit board via a first conductive material and a second conductive region formed on a second surface of the semiconductor substrate is connected to the metal electrode via a second conductive material, and supports that project outwards are provided on the first and second surfaces of the semiconductor substrate.

With this structure, when the reflow process is performed, even if the semiconductor substrate is mounted in a tilted state on the printed circuit board, or if the metal electrode is mounted in a tilted stated on the semiconductor substrate, the presence of the supports can suppress the tilting between the printed circuit board and the semiconductor substrate and the tilting between the metal electrode and the semiconductor substrate to within predetermined ranges. Even if there are warping and undulations in the silicon substrate and the printed circuit board, the electrodes of the printed circuit board and the metal electrode can be effectively prevented from being provided in a state where these electrodes are in contact with the semiconductor substrate.

Another aspect of the present invention is a power control semiconductor device, including: two semiconductor substrates that include diodes; a common electrode to which a first surface of each of the two semiconductor substrates is commonly connected; and first and second electrode terminals to which a second surface of each of the two semiconductor substrates are respectively connected, wherein conductive regions formed on the first surfaces of the two semiconductor substrates are connected to the common electrode via a first conductive material, and conductive regions formed on the second surfaces of the two semiconductor substrates are connected to the first and second electrode terminals via second conductive materials, and supports that project outwards are provided on each of the first surfaces and the second surfaces of the two semiconductor substrates.

Accordingly, when a reflow process is performed with the semiconductor substrates, the common electrode, and the electrode terminals having been arranged with a predetermined positional relationship, even if the semiconductor substrates and the common electrode are tilted, or if the electrode terminals and the semiconductor substrates are tilted, the presence of the supports can suppress the tilting between the semiconductor substrates and the common electrode and the tilting between the electrode terminals and the semiconductor substrates to within predetermined ranges. Even if there are warping and undulations in the semiconductor substrate, the common electrode, and the electrode terminals, the common electrode and the electrode terminals can be effectively prevented from being provided in a state where these parts are in contact with the semiconductor substrates.

A method of manufacturing a semiconductor device according to the present invention includes the following steps in the stated order: manufacturing a semiconductor substrate that has a first surface and a second surface; forming a support that projects from the first surface of the semiconductor substrate on the first surface; applying a conductive material onto the first surface with a greater thickness than the support; and performing a reflow process with an electrode terminal having been mounted on the conductive material so as to electrically connect a predetermined conductive region provided on the first surface with the electrode terminal.

By doing so, this method of manufacturing a semiconductor device according to the present invention can suppress the tilting of the electrode terminal in the process that connects the electrode terminal to within a predetermined range. Even if there are warping and undulations in the silicon substrate, the electrode terminal can be prevented from being provided in a state where the electrode terminal is in contact with the semiconductor substrate.

Another aspect of the present invention is a method of manufacturing a semiconductor device, including the following steps in the stated order: manufacturing a semiconductor substrate that has a first surface and a second surface; forming a first support that projects from the first surface of the semiconductor substrate on the first surface and a second support that projects from the second surface of the semiconductor substrate on the second surface; applying a first conductive material onto the first surface with a greater thickness than the first support and applying a second conductive material onto the second surface with a greater thickness than the second support; and performing a reflow process, with a first electrode terminal having been mounted on the first conductive material and a second electrode terminal having been mounted on the second conductive material, so as to electrically connect a predetermined conductive region provided on the first surface with the first electrode terminal and a predetermined conductive region provided on the second surface with the second electrode terminal.

By doing so, this method of manufacturing a semiconductor device according to the present invention can suppress the tilting of the electrode terminals in the process that connects the electrode terminals to within a predetermined range. Even if there are warping and undulations in the silicon substrate, the electrode terminals can be prevented from being provided in a state where the electrode terminals are in contact with the semiconductor substrate.

It is preferable for the support to be at least 10 µm thick and more preferable for the support to be at least 20 µm thick. By doing so, when the electrode terminal is provided on the conductive material, even if the electrode terminal is displaced and tilted, the support positioned below the electrode terminal reliably supports the electrode terminal, so that the tilting of the electrode terminal can be suppressed to within a predetermined range. Even when there are relatively large warping and undulations in the silicon substrate, the electrode terminal can be prevented from being provided in a state where the electrode terminal is in contact with the silicon substrate.

Another aspect of the present invention is a method of manufacturing a semiconductor device, comprising the following steps in the stated order: forming a first conductive region that has a first type of conductivity, with the first conductive region being exposed to a first surface of a semiconductor substrate; forming a second conductive region that has a second type of conductivity, which is an inverse of the first type of conductivity, inside the first conductive region with the second conductive region being exposed to the first surface; forming a support that projects from the first surface at or near a boundary between the first conductive region and the second conductive region; applying a conductive material onto the first conductive region and second conductive region of the semiconductor device with a greater thickness than the support; and performing a reflow process with an electrode terminal having been mounted on the conductive material so as to electrically connect the first and second conductive regions with the electrode terminal.

In this way, when the electrode terminal is connected, this method of manufacturing a semiconductor device according to the present invention can suppress the tilting of the electrode terminal to within a predetermined range with a relatively simple method where a process for forming a support is additionally performed. Even if there are warping and undulations in the silicon substrate, the electrode terminal can be prevented from being provided in a state where the electrode terminal is in contact with the silicon substrate. The support can also be prevented from projecting out of the conductive material and obstructing the attachment of the conductive material to the electrode terminal.

Between the step of forming the second conductive region and the step of forming the support, this method of manufacturing a semiconductor device according to the present invention may further include a step of forming an insulating film at or near an edge of the first conductive region, wherein the step of forming the support forms the support so that a top end of the support is positioned above a top end of the insulating film.

By doing so, since a method of manufacturing a semiconductor device always includes a process of forming an insulating film, by forming, after this insulating film forming process, a support whose top end is positioned above the top end of the insulating film, it is possible to reliably prevent the support from not reaching the electrode terminal and the electrode terminal being provided in contact with the silicon substrate, even if there are warping and undulations in the silicon substrate.

Between the step of forming the second conductive region and the step of forming the support, this method of manufacturing a semiconductor device according to the present invention may further include a step of forming an insulating film at or near an edge of the first conductive region and at or near the boundary between the first conductive region and the second conductive region, wherein the step of forming the support forms a glass layer on the insulating film formed at or near the boundary between the first conductive region and the second conductive region.

By doing so, since a method of manufacturing a semiconductor device always includes a process of forming an insulating film, by forming, in this insulating film forming process, an insulating film at the position where the support is to be formed and then forming a glass layer at this position, it is possible to reliably prevent the electrode terminal from not being supported by the support and being provided in contact with the silicon substrate, even if there are warping and undulations in the silicon substrate. The support itself also has a structure that is resistant to thermal stress.

Between the step of forming the second conductive region and the step of forming the support, this method of manufacturing a semiconductor device according to the present invention may further include a step of forming an insulating film at or near the first conductive region, wherein the step of forming the support includes: a step of forming a layer of an adhesive at or near a boundary of the first conductive region and the second conductive region; and a step of mounting a predetermined glass on the layer of adhesive.

By doing so, since a method of manufacturing a semiconductor device always includes a process of forming an insulating film, by performing, after this insulating film forming process, a process that forms a layer of adhesive at or near a boundary of the first conductive region and the second conductive region and a process that mounts a predetermined glass on the layer of adhesive, it is possible to reliably prevent the support from not reaching the electrode terminal and the electrode terminal from being provided in contact with the silicon substrate, even if there are warping and undulations in the silicon substrate. With this method, it is easy to form a support on a semiconductor device with a relatively large area.

In the method of manufacturing a semiconductor device according to the present invention, the step of forming the support may include: a step of forming a thick insulating film on the first surface; a step of performing etching so as to leave predetermined parts of the thick insulating film and form a thick insulating film at or near an edge of the first conductive region and at or near the boundary between the first conductive region and the second conductive region; and a step of performing etching on the thick insulating film at or near the edge of the first conductive region so as to reduce a thickness of the thick insulating film and produce an insulating film while not etching the thick insulating film at or near the boundary of the first conductive region and the second conductive region to make the support thicker than the insulating film.

By doing so, even if there are warping and undulations in the silicon substrate, a state where the support does not reach the electrode terminal and the electrode terminal is provided in a state where the electrode terminal is in contact with the silicon substrate can be reliably prevented. In addition, since a method of manufacturing a semiconductor device always includes a process for forming an insulating film, the above method has an advantage in that the support and the insulating film can be simultaneously produced.

BEST MODE FOR CARRYING OUT THE PRESENT INVENTION

First Embodiment

Figure 1:
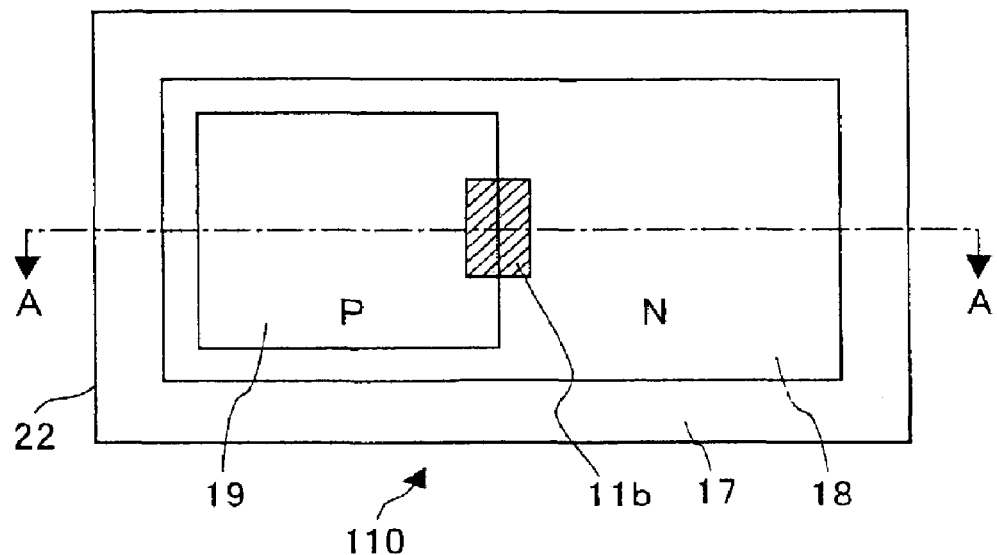
FIGS. 1(a) and 1(b) are explanatory views showing a semiconductor device according to the first embodiment of the present invention, with FIG. 1(a) being a planar view of the semiconductor device and FIG. 1(b) being a cross-sectional view of the semiconductor device taken along the line A—A.
Figure 1:
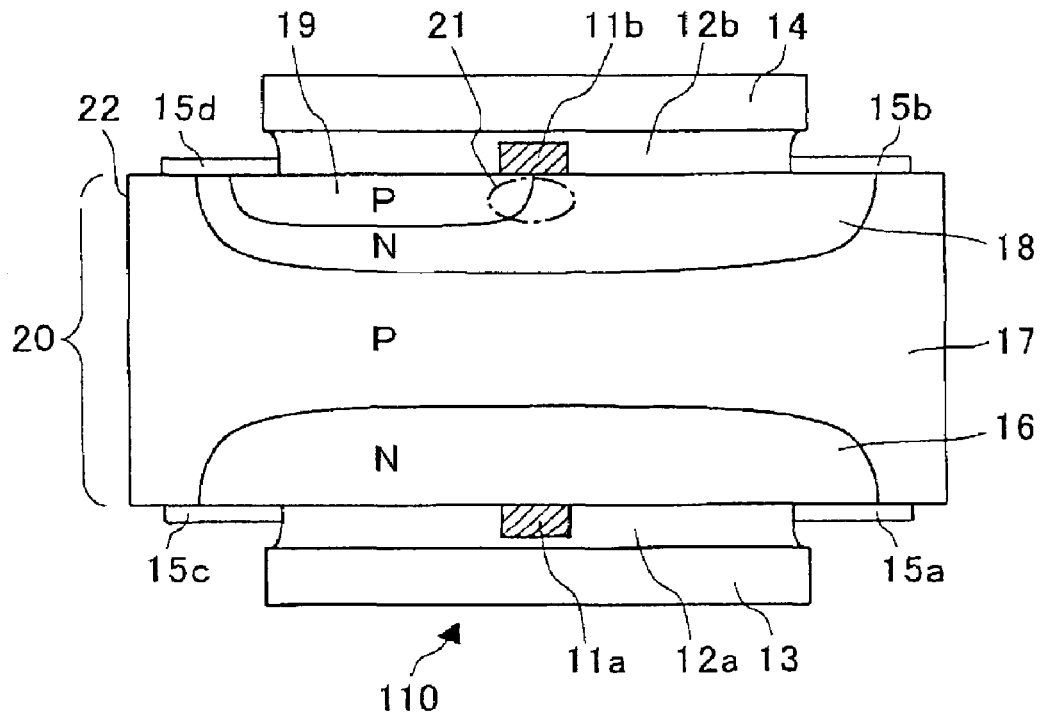

The following describes in detail, with reference to the attached drawings, a semiconductor device according to a first embodiment of the present invention. FIGS. 1(a) and 1(b) are explanatory views showing the semiconductor device according to the first embodiment of the present invention, with FIG. 1(a) being a planar view of the semiconductor device and FIG. 1(b) being a cross-sectional view of the semiconductor device taken along the line A—A. As shown in FIGS. 1(a) and 1(b), the semiconductor device 110 of the present invention is a three-terminal reverse blocking thyristor. In FIGS. 1(a) and 1(b), reference numeral 110 designates the semiconductor device, reference numerals 11a, 11b designate supports, reference numerals 12a, 12b designate solder, reference numeral 13 designates a cathode terminal, reference numeral 14 designates an anode terminal, reference numerals 15a to 15d designate insulating films, reference numeral 16 designates a first N-type layer, reference numeral 17 designates a first P-type layer, reference numeral 18 designates a second N-type layer, reference numeral 19 designates a second P-type layer, reference numeral 20 designates a silicon substrate, reference numeral 21 designates a PN junction peripheral part, and reference numeral 22 designates a side surface. It should be noted that the solder 12b, the anode terminal 14, the insulating films 15b, 15d have not been illustrated in FIG. 1(a). In order to simplify this and the following embodiments, the electrode terminals, solder, and insulating films have been omitted as necessary.

As shown in FIG. 1(b), the semiconductor device 110 is produced with the first N-type layer 16, the second N-type layer 18, and the second P-type layer 19 being formed inside the P-type silicon substrate 20. The remaining part in which these three layers are not formed composes the first P-type layer 17. The first N-type layer 16 is formed by doping the silicon substrate 20 with an N-type impurity, with the first N-type layer 16 extending from a second surface (the bottom surface in FIG. 1(b)) of the silicon substrate 20 towards the inside.

The first P-type layer 17 is exposed at the edges of the two main surfaces of the silicon substrate 20 and to the side surfaces of the silicon substrate 20, and is in contact with the first N-type layer 16 and the second N-type layer 18. The first P-type layer 17 is also connected to a gate electrode that has not been illustrated. The second N-type layer 18 is also formed by doping the silicon substrate 20 with an N-type impurity, and extends from a first surface of the silicon substrate 20, which is to say the opposite surface to the second surface where the first N-type layer 16 is formed, towards the inside. It should be noted that depending on how the semiconductor device. 110 is used, a plurality of gate electrodes may be provided, or conversely, the semiconductor device 110 may not be provided with a gate electrode.

The second P-type layer 19 formed inside the second N-type layer 18, is off-centered so as to be positioned close to the side surface 22 of the semiconductor device 110, and extends from the first surface of the silicon substrate 20 towards the inside. Also, as shown in FIG. 1(a), the second N-type layer 18 and the second P-type layer 19 are formed in the shape of rectangles, with the first N-type layer 16 (not shown in FIG. 1(a)) also being in the shape of a rectangle. The first N-type layer 16, the first P-type layer 17, the second N-type layer 18, and the second P-type layer 19 are formed one on top of the other and so form a PNPN junction. It should be noted that the first N-type layer 16, the first P-type layer 17, the second N-type layer 18, and the second P-type layer 19 do not need to be formed as rectangles, and may be formed in other shapes, such as ovals.

The support 11b, the solder 12b, the anode terminal 14, and the insulating films 15b, 15d are formed on the first surface of the silicon substrate 20. Like the support 11a, the support lib is formed of a glass material, and is disposed on a part of the boundary between the second N-type layer 18 and the second P-type layer 19 that is opposite the side surface 22. The solder 12b is formed substantially flat in a region in which the second N-type layer 18 is formed so as to cover the support 11b.

The support 11b is formed higher (thicker) than the insulating films 15b, 15d. As will be described later, to prevent the anode terminal 14 from tilting and coming into contact with the silicon substrate 20, it is preferable to make the support 11b high (thick) enough to support the anode terminal 14 from below, which is to say, higher (thicker) than the insulating films 15b, 15d.

The support 11b is formed thinner (lower) than the solder 12b, and preferably should be formed slightly lower than the solder 12b. This is because it is preferable for the support 11b that projects from the lower surface of the solder 12b not to obstruct the attachment of the solder 12b to the anode terminal 14.

The anode terminal 14 is formed on the solder 12b and is electrically connected to the second N-type layer 18 and the second P-type layer 19 via the solder 12b. The insulating film 15b is formed of a glass material, and covers the part of the boundary between the first P-type layer 17 and the second N-type layer 18 that is opposite the side surface 22 and the periphery of this part, thereby protecting the covered parts. In the same way, the insulating film 15d is also formed of a glass material, and covers the side surface 22 side parts of (i) the boundary of the first P-type layer 17 and the second N-type layer 18 and (ii) the boundary between the second N-type layer 18 and the second P-type layer 19, as well as the peripheries of these parts, thereby protecting the covered parts.

The support 11a, the solder 12a, the cathode terminal 13, and the insulating films 15a, 15c are provided on the second surface of the silicon substrate 20. The support 11a is formed of a glass material and is disposed substantially centrally in a surface region of the first N-type layer 16.

The support 11a is formed higher (thicker) than the insulating films 15a, 15c. As will be described later, to prevent the cathode terminal 13 from tilting and coming into contact with the silicon substrate 20, it is preferable to make the support 11a high (thick) enough to support the cathode terminal 13 from below, which is to say, higher (thicker) than the insulating films 15a, 15c.

The support 11a is formed thinner (lower) than the solder 12a, and preferably should be formed slightly lower than the solder 12a. This is because it is preferable for the support 11a that projects from the upper surface of the solder 12a not to obstruct the attachment of the solder 12a to the cathode terminal 13.

The solder 12a is formed substantially flat in a region in which the first N-type layer 16 is formed so as to cover the support 11a. It should be noted that when the solder 12a is provided by printing it onto the surface of the silicon substrate 20, the support 11a is produced with a thickness that allows the support 11a to be hidden within the solder 12a for the reasons given above.

The cathode terminal 13 is formed on the solder 12a and is electrically connected to the first N-type layer 16 via the solder 12a. The insulating films 15a, 15c are formed of a glass material, and cover the boundary between the first N-type layer 16 and the first P-type layer 17 and the periphery of this boundary, thereby protecting these parts. It should be noted that the insulating films 15a, 15c and the insulating films 15b, 15d may be formed of another insulating material, such as silicon oxide ($SiO_2$), instead of a glass material.

The following is an overview of the operation of the semiconductor device 110 with the structure described above. When a negative potential is applied to the cathode terminal 13, a positive potential is applied to the anode terminal 14 and a positive potential of a threshold value or higher is simultaneously applied to the gate electrode (not illustrated), positive holes and electrons are exchanged between the first N-type layer 16, the first P-type layer 17, the second N-type layer 18, and the second P-type layer 19, so that a current flows between the cathode terminal 13 and the anode terminal 14.

When the operation commences, this current flows from the solder 12b to the second N-type layer 18, but as time passes, the current that flows from the solder 12b to the second N-type layer 18 via the second P-type layer 19 increases. Since the second P-type layer 19 is provided off-center towards the side surface 22, when the majority of the current flows via the second P-type layer 19, such flow is concentrated in the center of the second P-type layer 19, and hardly any current flows at the PN junction peripheral part 21 near the interface between the second N-type layer 18 and the second P-type layer 19. Accordingly, when the semiconductor device 110 is turned on, the supports 11a, 11b do not obstruct the flow of current.

The following is an overview of the procedure that provides the cathode terminal 13 and the anode terminal 14 on the silicon substrate 20. First, the supports 11a, 11b and the solder 12a, 12b are provided in advance on the surfaces of the silicon substrate 20. Next, the cathode terminal 13 is mounted on the solder 12a and the anode terminal 14 is mounted on the solder 12b. After this, the silicon substrate 20 is placed in a reflow furnace, and the cathode terminal 13 and the anode terminal 14 are attached by melting the solder 12a, 12b.

There are cases, however, where during the mounting of the cathode terminal 13 and the anode terminal 14 on the solder 12a, 12b, one or both of the electrode terminals is mounted in a position that is displaced in one direction or the other. However, in the semiconductor device 110, the supports 11a, 11b are provided in advance, with the supports 11a, 11b supporting the electrode terminals from below and thereby preventing the electrode terminals from tilting significantly and so coming into contact with the silicon substrate 20.

As described above, the semiconductor device 110 according to the first embodiment of the present invention is provided with supports 11a, 11b so that when the cathode terminal 13 and the anode terminal 14 are provided on the silicon substrate 20, these electrode terminals can be prevented from being provided in a state where the electrode terminals are significantly tilted and contact the silicon substrate 20. The supports 11a, 11b are provided at positions on the surface of the silicon substrate 20 where it is difficult for current to flow, so that when the semiconductor device 110 is turned on, the supports 11a, 11b do not obstruct the flow of current.

It should be noted that the supports 11a, 11b can be formed of the same material and with the same height (thickness) as the insulating films 15a, 15c and the insulating films 15b, 15d. In this case, the supports 11a, 1b, the insulating films 15a, 15c and the insulating films 15b, 15d can be provided by the same process, so that there is no need for a special process for providing the supports 11a, 11b.

It should be noted that while the above embodiment has been described for the case where plate-like electrode terminals are provided on the semiconductor device 110, electrode terminals that are not plate-like, such as plate-like electrode terminals that have a cylindrical body provided on one side, may be used in place of plate-like electrode terminals.

Figure 2:
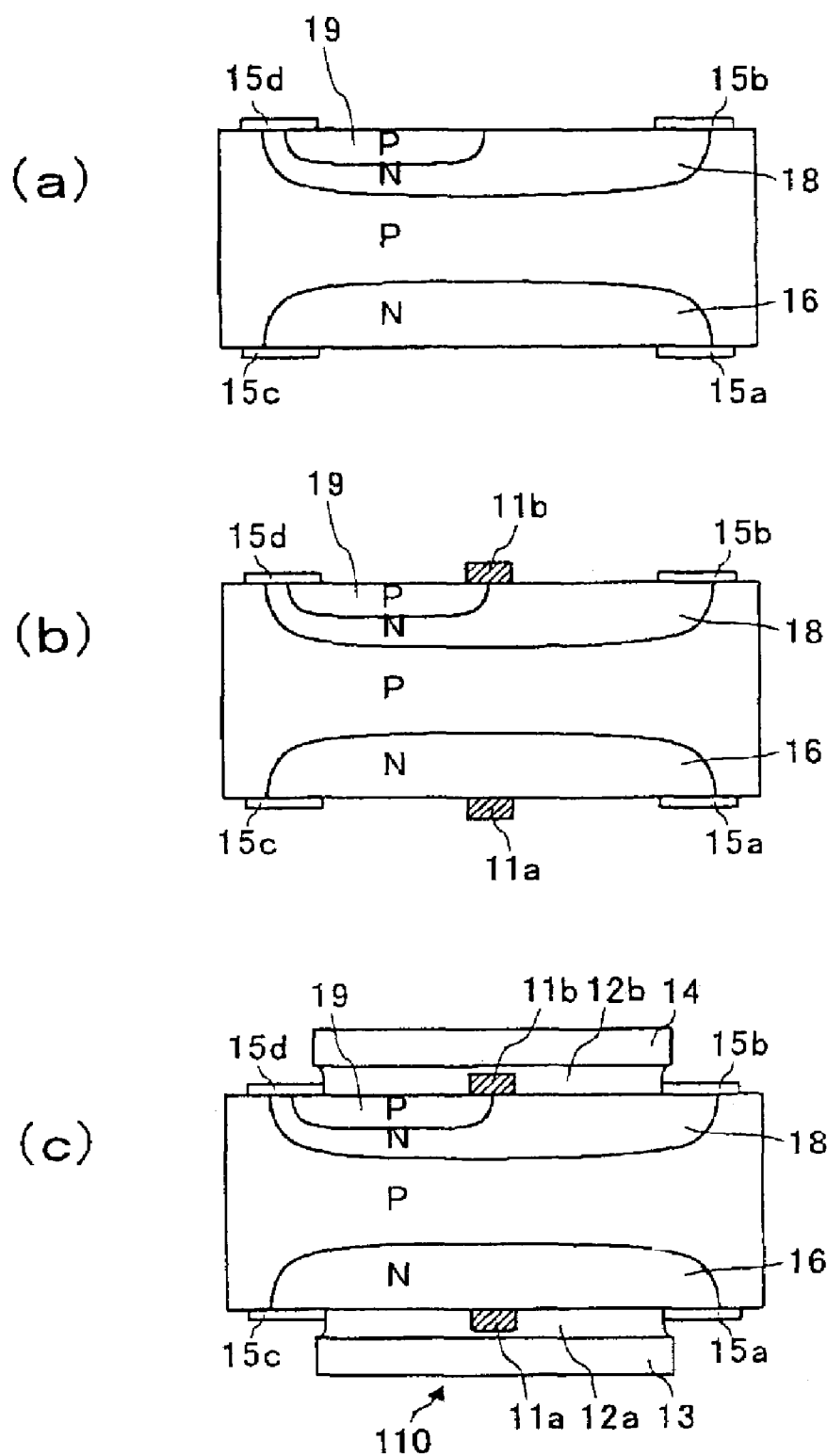
FIGS. 2(a) to 2(c) show the manufacturing processes for the semiconductor device according to the first embodiment of the present invention.

The following describes, using FIGS. 2(a) to 2(c), a method of manufacturing the semiconductor device 110 according to the first embodiment of the present invention. As shown in FIG. 2, the semiconductor device 110 according to the first embodiment is manufactured by the following processes.

(1) Manufacturing Process for the Semiconductor Device (Main Body)

First, a semiconductor device (main body) that has (1) the second N-type layer 18 that is formed by exposing one surface of the silicon substrate 20, (2) the second P-type layer 19 that is formed inside the second P-type layer 19 when exposing this surface of the silicon substrate 20, and (3) the first N-type layer 16 that is formed by exposing the other surface of the silicon substrate 20, is manufactured (not illustrated).

(2) Insulating Film Forming Process

Next, the insulating films 15b, 15d are formed at the boundary of the second N-type layer 18 or the periphery of this boundary and the insulating films 15a, 15c are formed at the boundary of the first N-type layer 16 or the periphery of this boundary (see FIG. 2(a)).

(3) Support Forming Process

Next, the support 1b is formed so as to project from the surface of the silicon substrate 20 at the boundary between the second N-type layer 18 and the second P-type layer 19 or at the periphery of this boundary, with the upper end of the support 11b being higher than the upper ends of the insulating films 15b, 15d. The support 11a is formed so as to project from the surface of the first N-type layer 16, with the upper end of the support 11a being higher than the upper ends of the insulating films 15a, 15c (see FIG. 2(b)).

The supports 11b, 11a are manufactured by coating the semiconductor device (main body) with a resist that includes a glass material using a metal mask. After this, the entire semiconductor device (main body) is calcinated, and the resist, in which a pattern has been formed, is converted into glass.

(4) Conductive Material Applying Process

Next, the solder 12b is applied on the second N-type layer 18 and the second P-type layer 19 as a conductive material that is thicker than the support 11b, and the solder 12a is applied onto the first N-type layer 16 of the, semiconductor device so as to be thicker than the support 11a (not illustrated).

(5) Reflow Process

Finally, a reflow process is performed with the anode terminal 14 and the cathode terminal 13 having been mounted on the solder 12b, 12a, so that the anode terminal 14 is electrically connected to the second N-type layer 18 and the second P-type layer 19 and the cathode terminal 13 is electrically connected to the first N-type layer 16 (see FIG. 2(*c*)).

The semiconductor device 110 according to the first embodiment of the present invention is manufactured by performing the above manufacturing processes. This method of manufacturing a semiconductor device according to the first embodiment can manufacture a semiconductor device with the superior effects described above in a relatively simple manner where a support forming process is additionally performed after the insulating film forming process.

Second Embodiment

Figure 3:
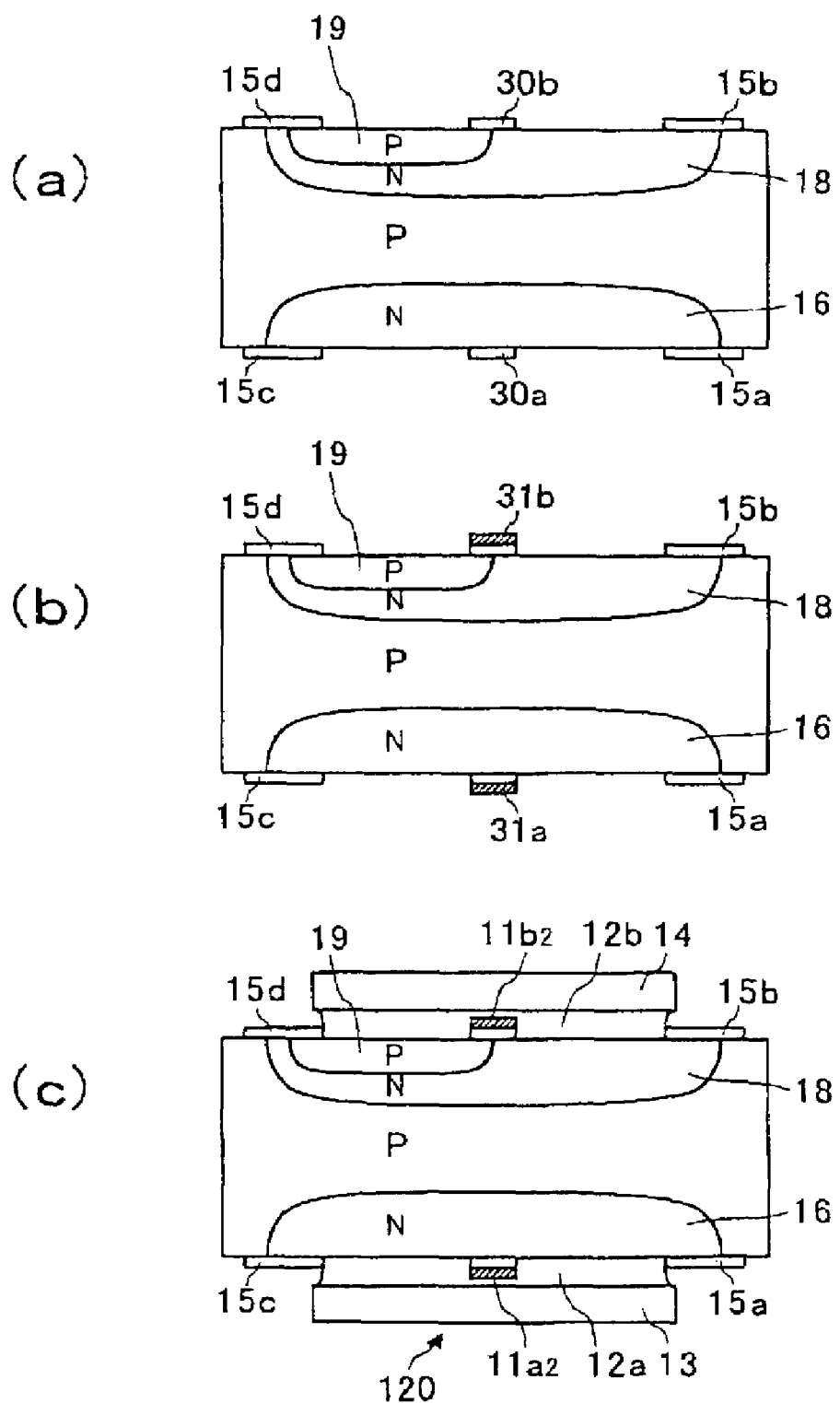
FIGS. 3(a) to 3(c) show the manufacturing processes for the semiconductor device according to the second embodiment of the present invention.

Next, a method of manufacturing a semiconductor device 120 according to a second embodiment of the present invention is described using FIGS. 3(*a*) to 3(*c*). As shown in FIGS. 3(*a*) to 3(*c*), the semiconductor device 120 according to the second embodiment is manufactured by the following processes.

(1) Manufacturing Process for the Semiconductor Device (Main Body)

First, the semiconductor device (main body) is manufactured in the same way as in the first embodiment (not illustrated).

(2) Insulating Film Forming Process

Next, the insulating films 15*b*, 15*d*, 30*b* are formed at the boundary of the second N-type layer 18 or the periphery of this boundary and at the boundary between the second N-type layer 18 and the second P-type layer 19 or the periphery of this boundary. The insulating films 15*a*, 15*c*, 30*a* are formed at the boundary of the first N-type layer 16 or the periphery of this boundary and additionally in a central part of the first N-type layer 16 (see FIG. 3(*a*)).

(3) Support Forming Process

Next, a glass layer 31*b* is formed on the insulating film 30*b* formed at the boundary between the second N-type layer 18 and the second P-type layer 19 or the periphery of this boundary according to the same method as in the first embodiment, and this glass layer 31*b* is set as the support 11*b*$_2$. In the same way, a glass layer 31*a* is formed on the insulating film 30*a* formed in the center of the first N-type layer 16 and is set as the support 11*a*$_2$ (see FIG. 3(*b*)).

(4) Conductive Material Applying Process

Next, the solder 12*b* is applied on the second N-type layer 18 and the second P-type layer 19 of the semiconductor device so as to be thicker than the support 11*b*$_2$, and the solder 12*a* is applied onto the first N-type layer 16 of the semiconductor device so as to be thicker than the support 11*a*$_2$ (not illustrated).

(5) Reflow Process

Finally, a reflow process is performed with the anode terminal 14 and the cathode terminal 13 having been mounted on the solder 12*b*, 12*a*, so that the anode terminal 14 is electrically connected to the second N-type layer 18 and the second P-type layer 19 and the cathode terminal 13 is electrically connected to the first N-type layer 16 (see FIG. 3(*c*)).

The semiconductor device 120 according to the second embodiment of the present invention is manufactured by performing the above manufacturing processes. This method of manufacturing a semiconductor device according to the second embodiment realizes the same effects as the method of manufacturing according to the first embodiment of the present invention, with there being a further effect in that it is possible to manufacture the supports 11*b*$_2$, 11*a*$_2$ with a structure that is resistant to thermal stress.

Third Embodiment

Figure 4:
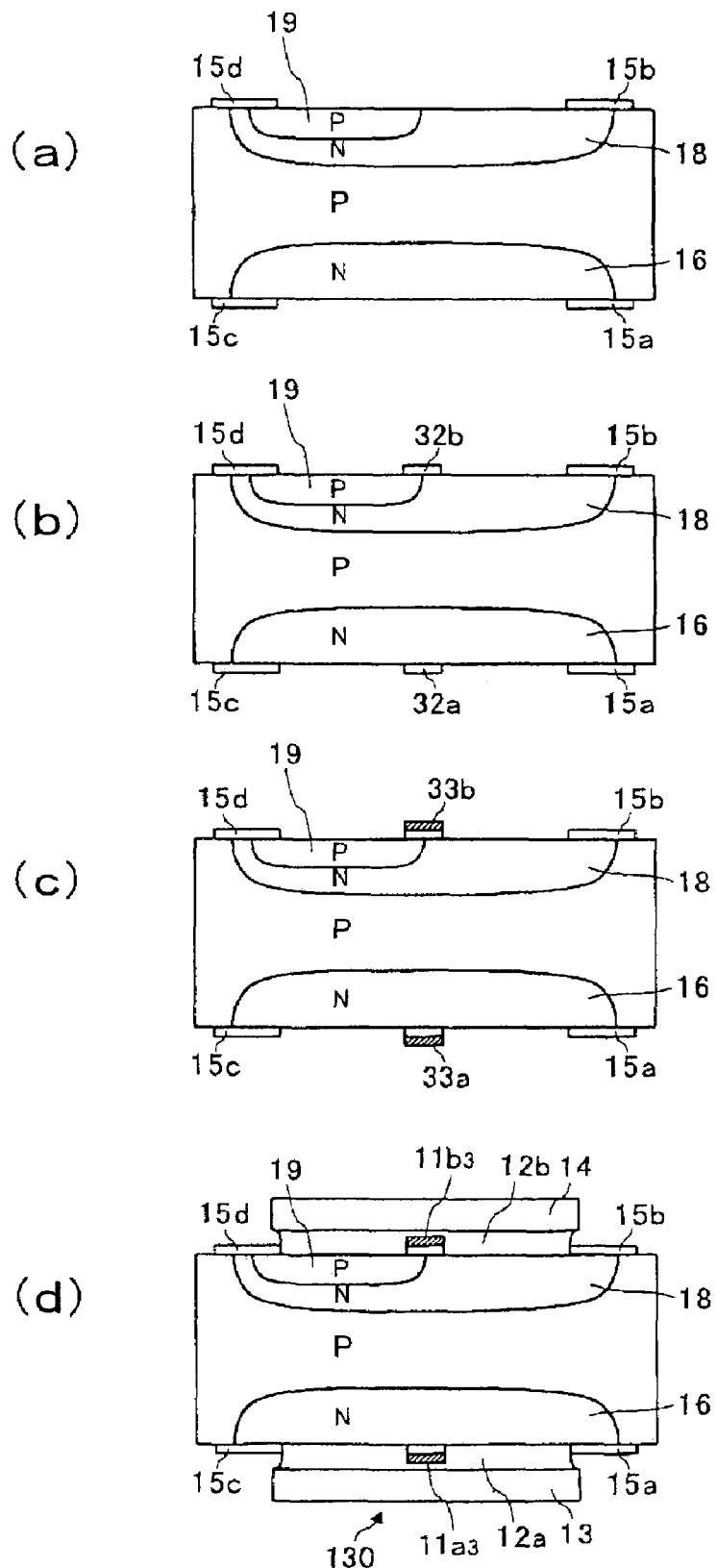
FIGS. 4(a) to 4(d) show the manufacturing processes for the semiconductor device according to the third embodiment of the present invention.

Next, a method of manufacturing a semiconductor device 130 according to a third embodiment of the present invention is described using FIGS. 4(*a*) to 4(*d*). As shown in FIGS. 4(*a*) to 4(*d*), the semiconductor device 130 according to the third embodiment is manufactured by the following processes.

(1) Manufacturing Process for the Semiconductor Device (Main Body)

First, the semiconductor device (main body) is manufactured in the same way as in the first embodiment (not illustrated).

(2) Insulating Film Forming Process

Next, the insulating films 15*b*, 15*d* are formed at the boundary of the second N-type layer 18 or the periphery of this boundary and the insulating films 15*a*, 15*c* are formed at the boundary of the first N-type layer 16 or the periphery of this boundary (see FIG. 4(*a*)).

(3) Support Forming Process

After this, a layer 32*b* of adhesive is formed at the boundary between the second N-type layer 18 and the second P-type layer 19 or at the periphery of this boundary (see FIG. 4(*b*)). A glass layer 33*b* is formed on this layer 32*b* and is set as the support 11*b*$_3$ (see FIG. 4(*c*)). In the same way, a layer 32*a* of adhesive is formed in a central part of the first N-type layer 16 (see FIG. 4(*b*)), and a glass layer 33*a* is formed on this layer 32*a* and is set as the support 11*a*3 (see FIG. 4(*c*)).

(4) Conductive Material Applying Process

Next, the solder 12*b* is applied on the second N-type layer 18 and the second P-type layer 19 of the semiconductor device so as to be thicker than the support 11*b*$_3$, and the solder 12*a* is applied onto the first N-type layer 16 of the semiconductor device so as to be thicker than the support 11*a*$_3$ (not illustrated).

(5) Reflow Process

Finally, a reflow process is performed with the anode terminal 14 and the cathode terminal 13 having been mounted on the solder 12*b*, 12*a*, so that the anode terminal 14 is electrically connected to the second N-type layer 18 and second P-type layer 19 and the cathode terminal 13 is electrically connected to the first N-type layer 16 (see FIG. 4(*d*)).

The semiconductor device 130 according to the third embodiment of the present invention is manufactured by performing the above manufacturing processes. This method of manufacturing a semiconductor device according to the third embodiment realizes the same effects as the method of manufacturing according the first embodiment of the present invention, with there being a further effect of the ease with which supports can be formed on a semiconductor device with a relatively large area.

Fourth Embodiment

Figure 5:
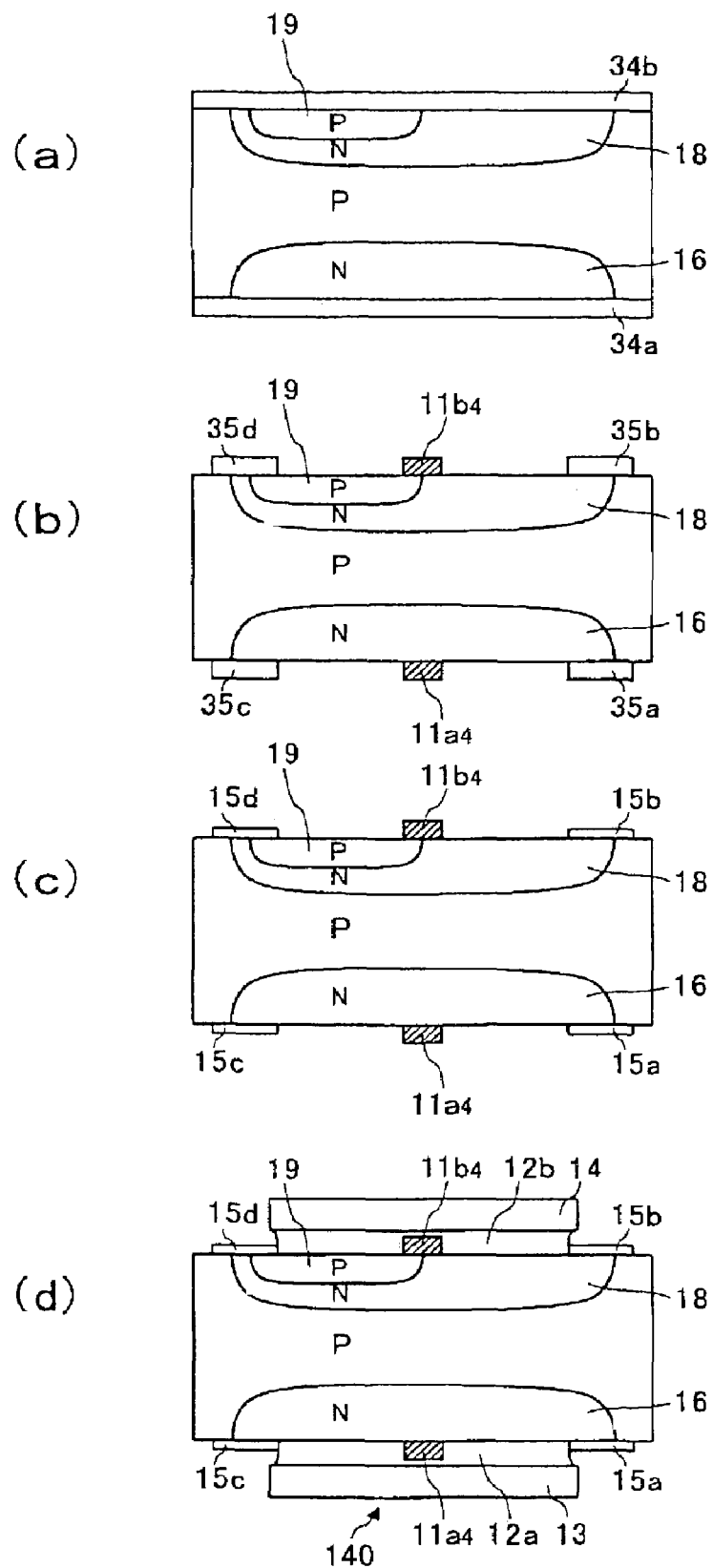
FIGS. 5(a) to 5(d) show the manufacturing processes for the semiconductor device according to the fourth embodiment of the present invention.

Next, a method of manufacturing a semiconductor device 140 according to a fourth embodiment of the present invention is described using FIGS. 5(*a*) to 5(*d*). As shown in FIGS. 5(*a*) to 5(*d*), the semiconductor device 140 according to the fourth embodiment is manufactured by the following processes.

(1) Manufacturing Process for the Semiconductor Device (Main Body)

First, the semiconductor device (main body) is manufactured in the same way as in the first embodiment (not illustrated).

(2) Insulating Film Forming Process

Next, a thick insulating film $34b$ is formed on one entire surface of the semiconductor device (main body) and a thick insulating film $34a$ is formed on another entire surface of the semiconductor device (main body) (see FIG. 5($a$)).

(3) Support Forming Process

After this, etching is performed so as to leave the thick insulating film $34b$ at desired positions, thereby forming thick insulating films $35b$, $35d$, $11b_4$ at the boundary of the second N-type layer 18 or at the periphery of this boundary and at the boundary between the second N-type layer 18 and the second P-type layer 19 or at the periphery of this boundary (see FIG. 5($b$)). In the same way, etching is performed so as to leave the thick insulating film $34a$ at desired positions, thereby forming thick insulating films $35a$, $35c$, $11a_4$ at the boundary of the first N-type layer 16 or the periphery of this boundary and at a central part of the first N-type layer 16 (see FIG. 5($b$)).

After this, the thick insulating films $35b$, $35d$, $35a$, and $35c$ may be left as they are, or only these parts may be subjected to selective etching to reduce the thickness of the films, thereby converting the thick insulating films into the insulating films $15b$, $15d$, $15a$, $15c$ that are in the form of thin films (see FIG. 5($c$)).

(4) Conductive Material Applying Process

Next, the solder $12b$ is applied on the second N-type layer 18 and the second P-type layer 19 of the semiconductor device so as to be thicker than the support $11b_4$, and the solder $12a$ is applied onto the first N-type layer 16 of the semiconductor device so as to be thicker than the support $11a_4$ (not illustrated).

(5) Reflow Process

Finally, a reflow process is performed with the anode terminal 14 and the cathode terminal 13 having been mounted on the solder $12b$, $12a$, so that the anode terminal 14 is electrically connected to the second N-type layer 18 and the second P-type layer 19 and the cathode terminal 13 is electrically connected to the first N-type layer 16 (see FIG. 5($d$)).

The semiconductor device 140 according to the fourth embodiment of the present invention is manufactured by performing the above manufacturing processes. This method of manufacturing a semiconductor device according to the fourth embodiment realizes the same effects as the method of manufacturing according the first embodiment of the present invention, with there being a further effect in that the insulating films and supports can be produced at the same time.

Fifth Embodiment

Figure 6:
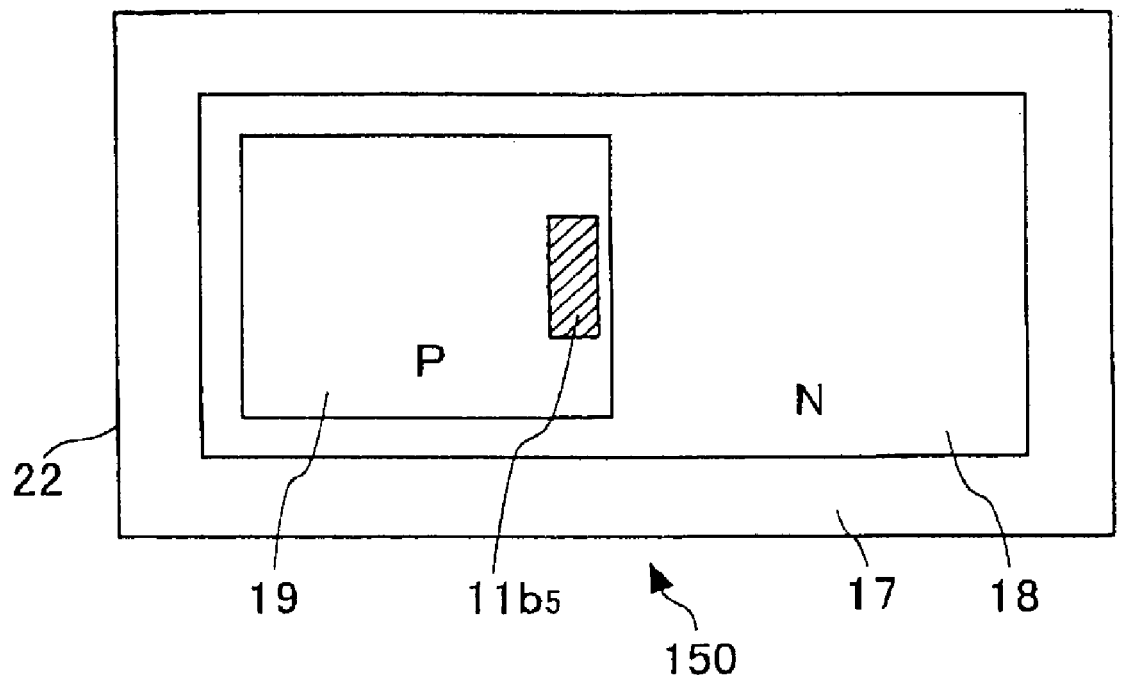
FIG. 6 is a planar view showing the semiconductor device according to the fifth embodiment of the present invention.

Next, a semiconductor device 150 according to a fifth embodiment of the present invention is described. FIG. 6 is a planar view showing the semiconductor device 150 according to the fifth embodiment of the present invention.

As shown in FIG. 6, the semiconductor device 150 according to, the fifth embodiment of the present invention has a support $11b_5$ provided in a side part of an internal region of the second P-type layer 19. It should be noted that the support $11b_5$ in this fifth embodiment is provided in a periphery of a part of the boundary between the second N-type layer 18 and the second P-type layer 19 that is opposite the side surface 22 so as to minimize the effects on the flow of current when the semiconductor device 150 is turned on.

Sixth Embodiment

Figure 7:
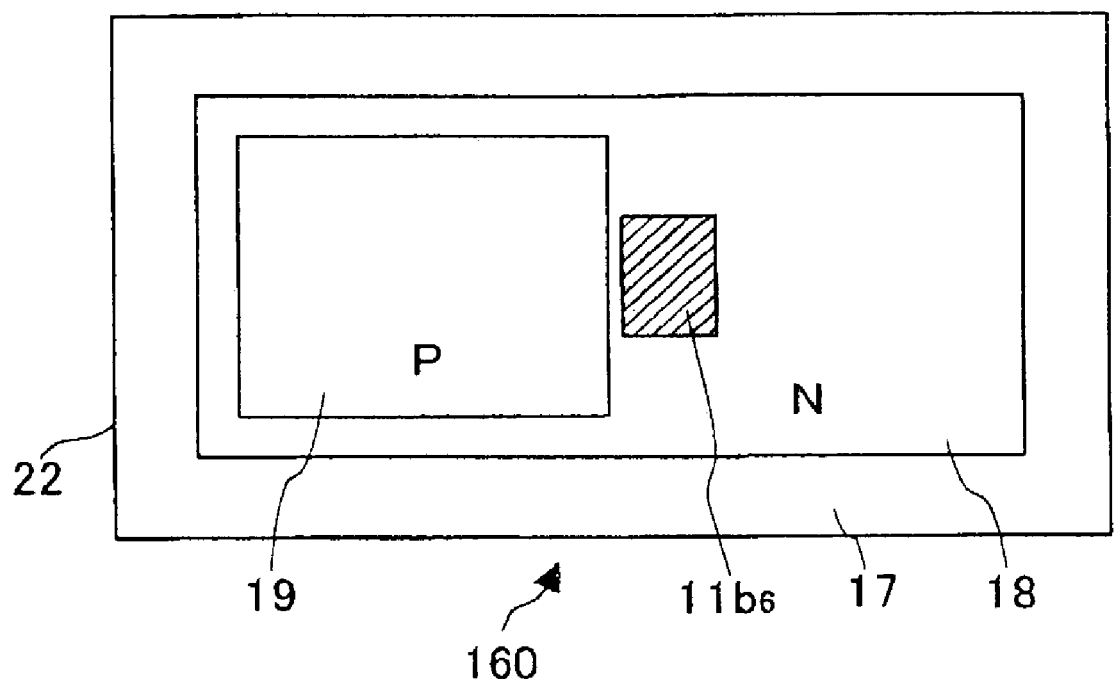
FIG. 7 is a planar view showing the semiconductor device according to the sixth embodiment of the present invention.

Next, a semiconductor device 160 according to a sixth embodiment of the present invention is described. FIG. 7 is a planar view showing the semiconductor device 160 according to the sixth embodiment of the present invention.

As shown in FIG. 7, the semiconductor device 160 according to the sixth embodiment of the present invention has a support $11b_6$ provided in a side part of an internal region of the second N-type layer 18. It should be noted that the support $11b_6$ in this sixth embodiment is provided in a periphery of a part of the boundary between the second N-type layer 18 and the second P-type layer 19 that is opposite the side surface 22 so as to minimize the effects on the flow of current when the semiconductor device 160 is turned on.

As described above, the semiconductor devices 150, 160 according to the fifth and sixth embodiments of the present invention have the supports $11b_5$, $11b_6$ formed at positions that are not on the boundary between the second N-type layer 18 and the second P-type layer 19, so that while there is a slightly larger effect on the current when the semiconductor devices 150, 160 are turned on compared to the semiconductor device 110 of the first embodiment of the present invention, the supports can be positioned with greater freedom. Accordingly, the positions of the supports can be appropriately set for various conditions, such as the size of the anode terminal 14.

Seventh Embodiment

Figure 8:
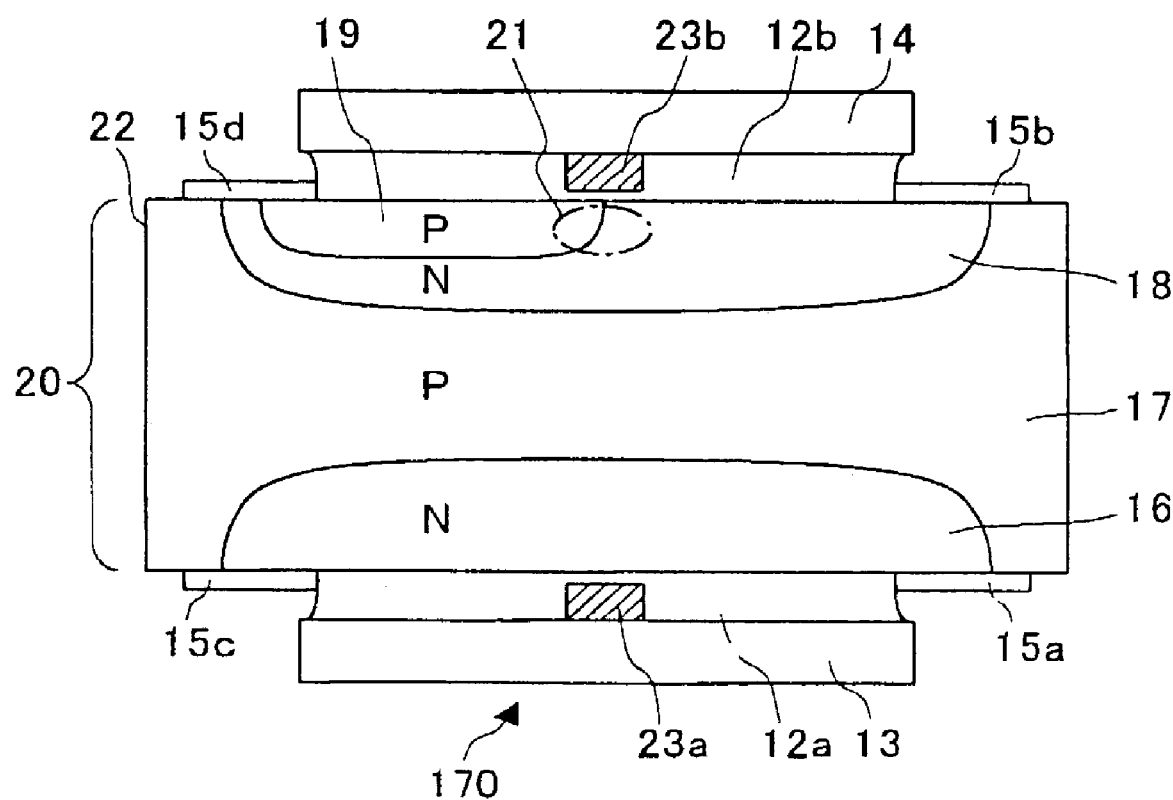
FIG. 8 is a cross-sectional view showing the semiconductor device according to the seventh embodiment of the, present invention.

Next, a semiconductor device 170 according to a seventh embodiment of the present invention is described. FIG. 8 is a cross-sectional view showing the semiconductor device 170 according to the seventh embodiment of the present invention. The reference numerals used in this drawing are the same as those in FIGS. 1($a$) and 1($b$). In FIG. 8, reference numerals $23a$, $23b$ designate supports, and the other reference numerals designate the same parts as in FIG. 1.

As shown in FIG. 8, in the semiconductor device 170 according to the seventh embodiment of the present invention, the supports $23a$, $23b$ are provided on the cathode terminal 13 and the anode terminal 14 respectively, not on the surfaces of the silicon substrate 20. It should be noted that it is preferable for the heights of the supports $23a$, $23b$ to be set using the same conditions as the supports $11a$, $11b$.

With the semiconductor device 170 according to the seventh embodiment of the present invention, the supports $23a$, $23b$ are respectively provided on the surfaces of the cathode terminal 13 and the anode terminal 14 that face the silicon substrate 20, so that when the cathode terminal 13 and the anode terminal 14 are provided, even if the cathode terminal 13 and the anode terminal 14 are tilted, the supports $23a$, $23b$ contact the surfaces of the silicon substrate 20 and so prevent the electrode terminals from tilting by a predetermined amount or more. In this way, the same effects as the semiconductor device according to the first embodiment of the present invention can be obtained without modifying the processes that provide the solder $12a$, $12b$ and the insulating films $15a$ to $15d$.

It should be noted that in each of the above embodiments, the supports are described as being in the form of rectangular solids, though the supports may be formed in other shapes, such as cylinders or hemispheres. Also, while the provision of one support for each of the cathode terminal and the anode terminal has been described, so long as the flow of current is not obstructed when the semiconductor device is turned on, it is preferable to provide a plurality, such as two, three, or four, supports for one or both of the electrode terminals to reliably prevent tilting of the electrode terminals. In the above embodiments, thyristor-type semiconductor devices are described as examples, though the present invention may be applied to other types of semiconductor device, such as a triac, where it is possible to form a support on a PN junction.

Eighth Embodiment

Figure 9:
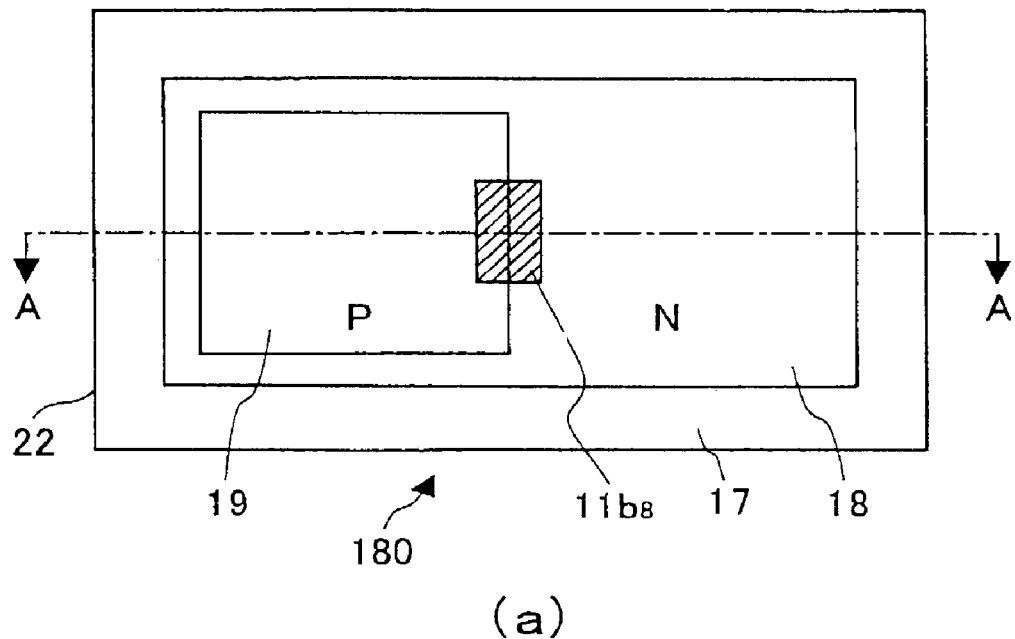
FIGS. 9(a) and 9(b) are explanatory views showing the semiconductor device according to the eighth embodiment of the present invention, with FIG. 9(a) being a planar view of the semiconductor device and FIG. 9(b) being a cross-sectional view of the semiconductor device taken along the line A—A.
Figure 9:
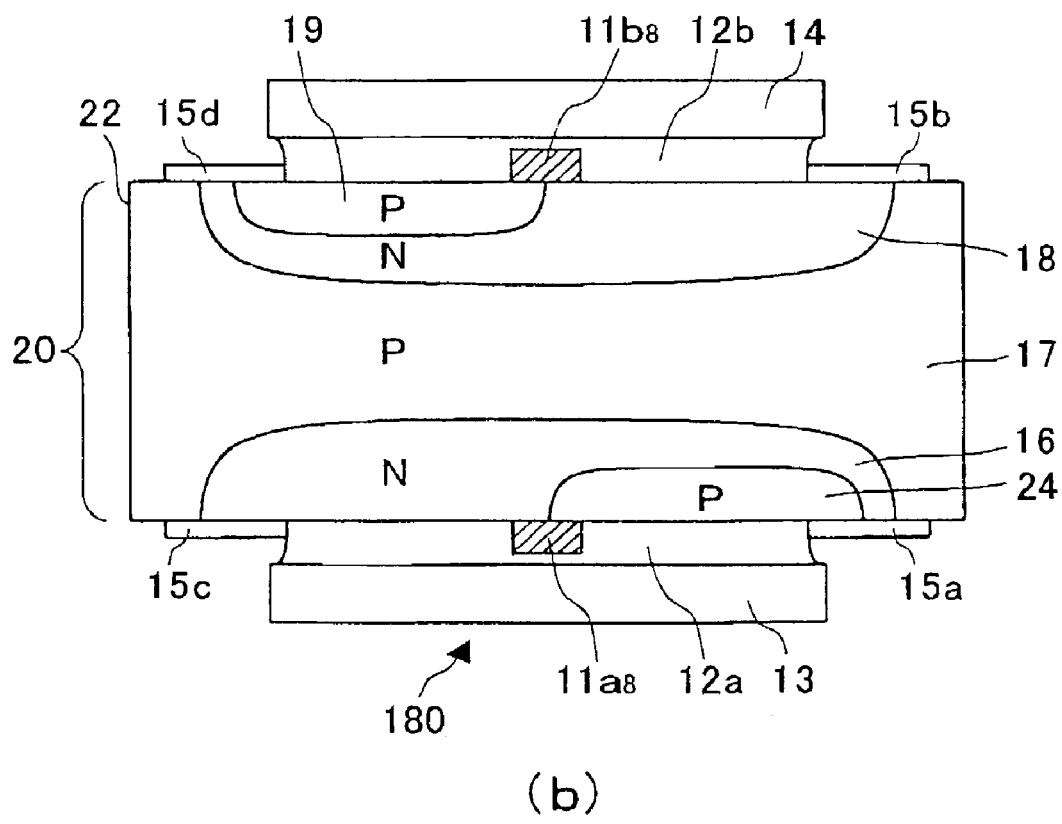

Next, a semiconductor device 180 according to an eighth embodiment of the present invention is described. FIGS. 9(a) and 9(b) show the semiconductor device 180 according to the eighth embodiment of the present invention, with FIG. 9(a) being a planar view of the semiconductor device 180 and FIG. 9(b) being a cross-sectional view of the semiconductor device 180 taken along the line A—A.

The semiconductor device 180 according to this eighth embodiment differs from the semiconductor device 110 according to the first embodiment in the structure of the second surface. This is to say, while the first N-type layer 16 is provided on the second surface of the semiconductor device 110 according to the first embodiment, the first N-type layer 16 and a third P-type layer 24 that is formed inside the first N-type layer 16 are provided on the second surface of the semiconductor device 180 according to the eighth embodiment. In this way, the semiconductor device 180 according to the eighth embodiment is a bidirectional thyristor.

The semiconductor device 180 according to the eighth embodiment has the same structure as the first surface of the semiconductor device 110 according to the first embodiment on both the first and second surfaces, and so obtains the same effects has the semiconductor device 110 according to the first embodiment.

Ninth Embodiment

Figure 10:
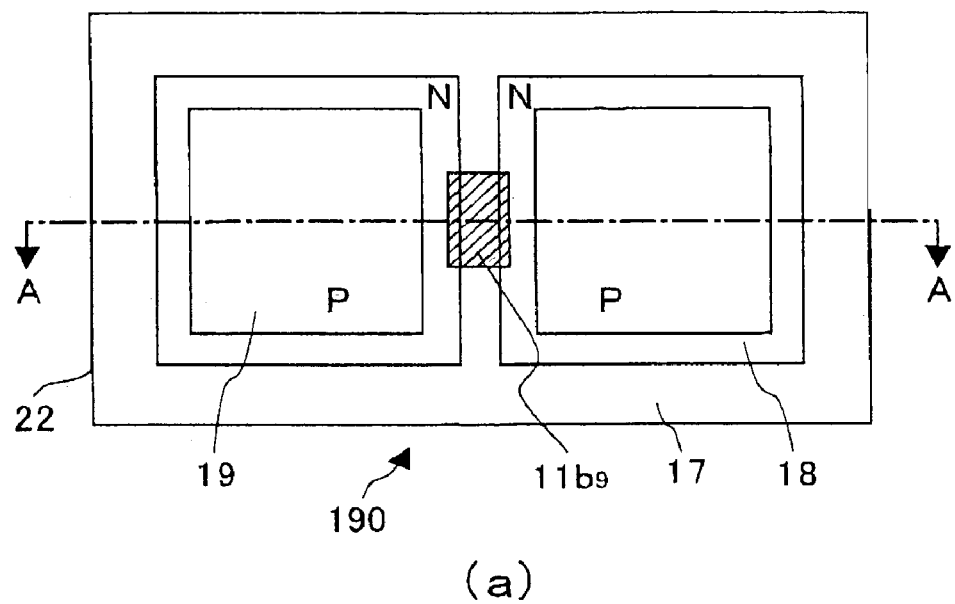
FIGS. 10(a) and 10(b) are explanatory views showing the semiconductor device according to the ninth embodiment of the present invention, with FIG. 10(a) being a planar view of the semiconductor device and FIG. 10(b) being a cross-sectional view of the semiconductor device taken along the line A—A.
Figure 10:
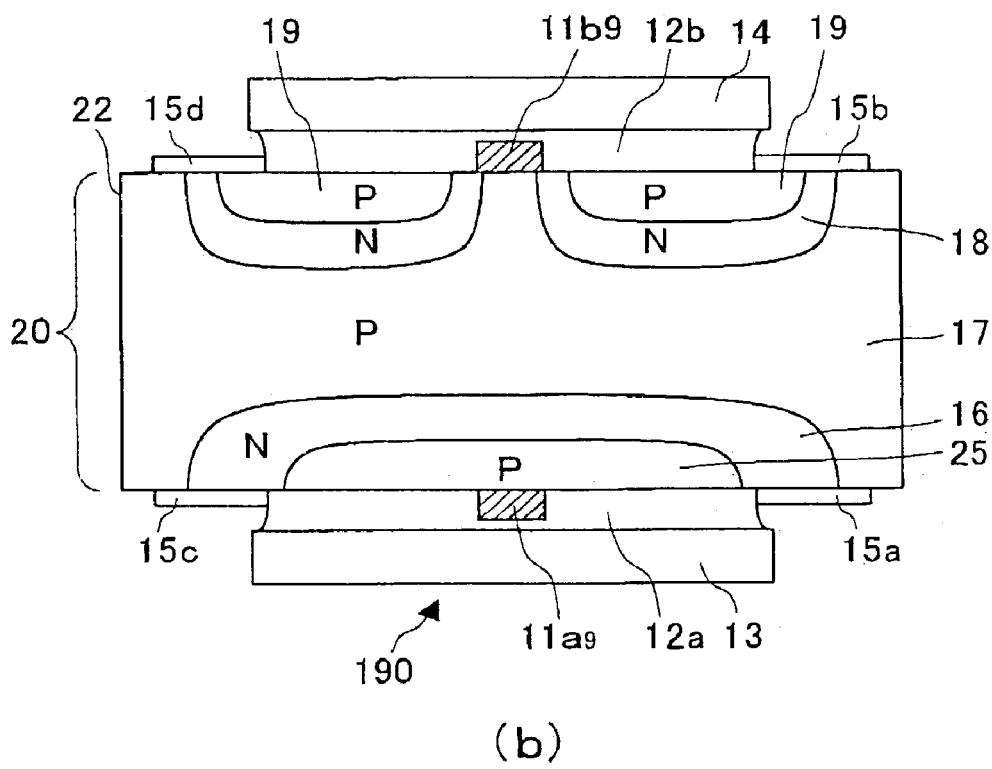

Next, a semiconductor device 190 according to a ninth embodiment of the present invention is described. FIGS. 10(a) and 10(b) show the semiconductor device 190 according to the ninth embodiment of the present invention, with FIG. 10(a) being a planar view of the semiconductor device 190 and FIG. 10(b) being a cross-sectional view of the semiconductor device 190 taken along the line A—A.

The semiconductor device 190 according to this ninth embodiment differs from the semiconductor device 180 according to the eighth embodiment in the number of thyristors included in the semiconductor device. This is to say, while the semiconductor device 180 according to the eighth embodiment includes one bidirectional thyristor, the semiconductor device 190 according to the ninth embodiment includes two bidirectional thyristors.

In the semiconductor device 190 according to this ninth embodiment, two second N-type layers 18 are formed on one surface and a second P-type layer 19 is formed inside each of these two second N-type layers 18.

In the semiconductor device 190 according to the ninth embodiment, a support $11b_9$ is formed in a region that faces the two second N-type layers 18. There is fundamentally little flow of current in this region that faces the two second N-type layers 18, so that the semiconductor device 190 has a structure where the obstruction of the flow of current by the support $11b_9$ is very effectively suppressed.

Tenth Embodiment

Figure 11:
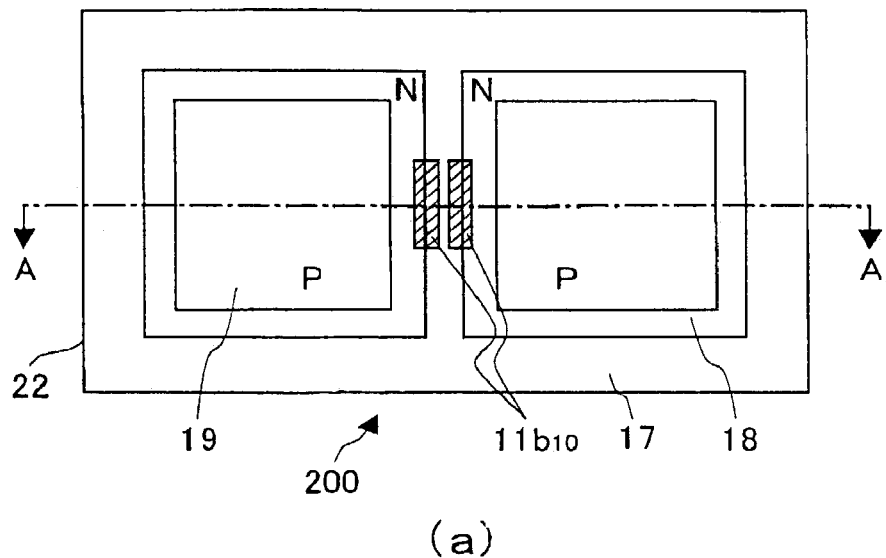
FIGS. 11(a) and 11(b) are explanatory views showing the semiconductor device according to the tenth embodiment of the present invention, with FIG. 11(a) being a planar view of the semiconductor device and FIG. 11(b) being a cross-sectional view of the semiconductor device taken along the line A—A.
Figure 11:
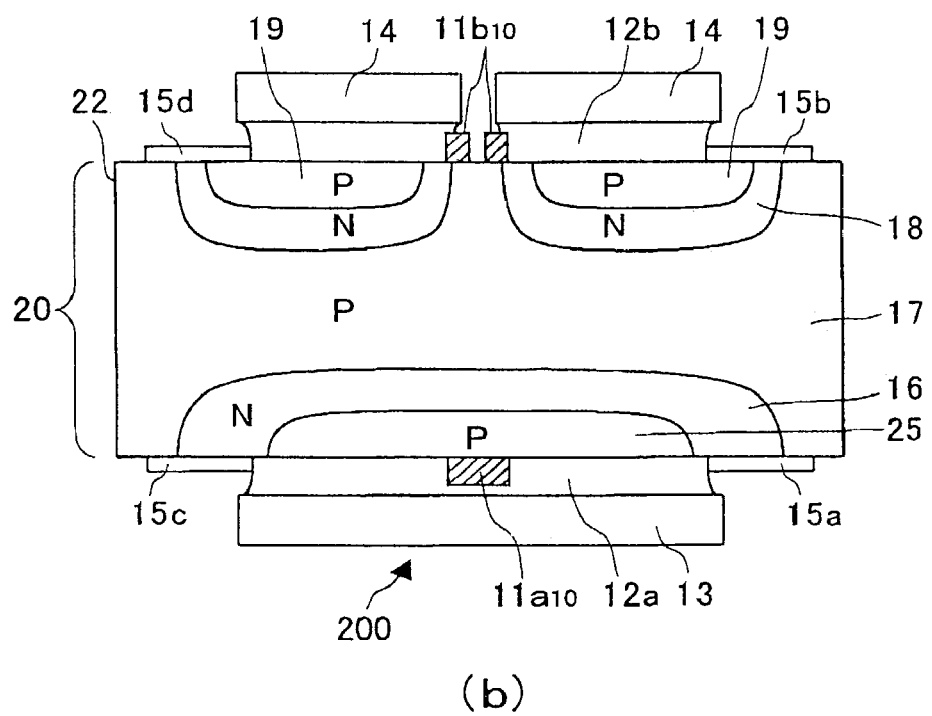

Next, a semiconductor device 200 according to a tenth embodiment of the present invention is described. FIGS. 11(a) and 11(b) show the semiconductor device 200 according to the tenth embodiment of the present invention, with FIG. 11(a) being a planar view of the semiconductor device 200 and FIG. 11(b) being a cross-sectional view of the semiconductor device 200 taken along the line A—A.

The semiconductor device 200 according to the tenth embodiment differs from the semiconductor device 190 according to the ninth embodiment in the number of anode terminals 14. This is to say, while the semiconductor device 190 according to the ninth embodiment includes one anode terminal 14, the semiconductor device 200 according to the tenth embodiment includes two anode terminals 14.

Corresponding to this, in the semiconductor device 200 according to the tenth embodiment, two supports $11b_{10}$ are formed in a region that faces the two second N-type layers 18. There is fundamentally little flow of current in this region that faces the two second N-type layers 18, so that the semiconductor device 200 has a structure where the obstruction of the flow of current by the supports $11b_{10}$ is very effectively suppressed.

Eleventh Embodiment

Figure 12:
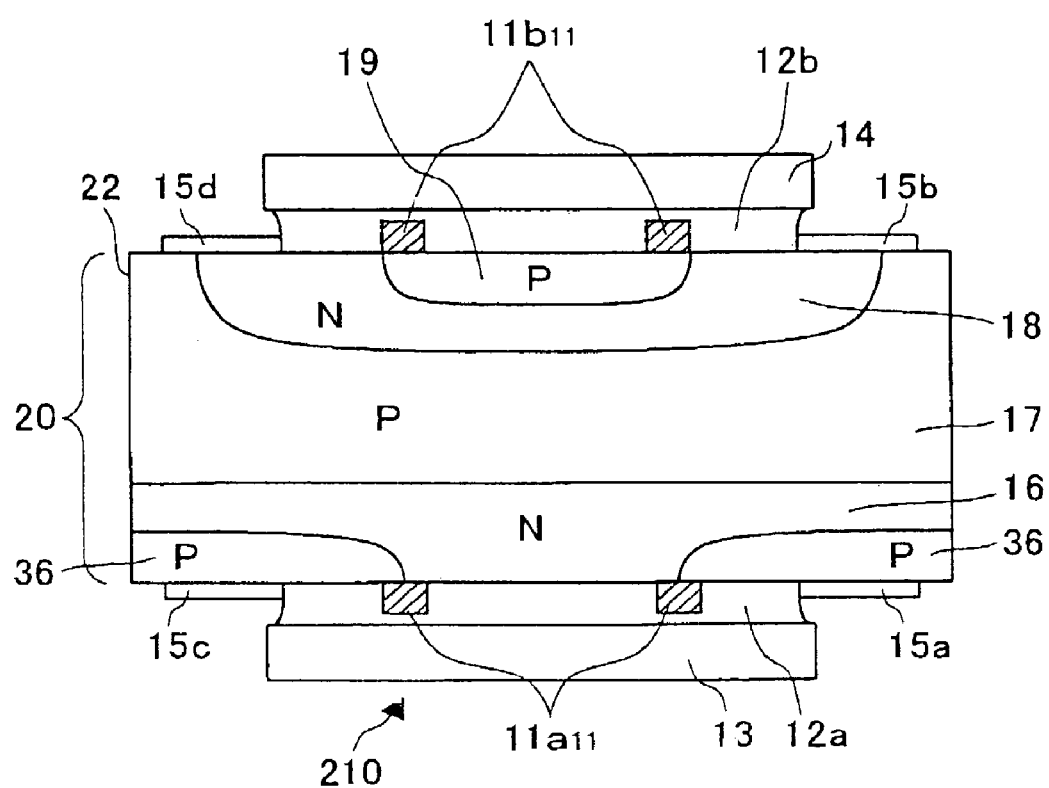
FIG. 12 is a cross-sectional view showing the semiconductor device according to the eleventh embodiment of the present invention.
Figure 13:
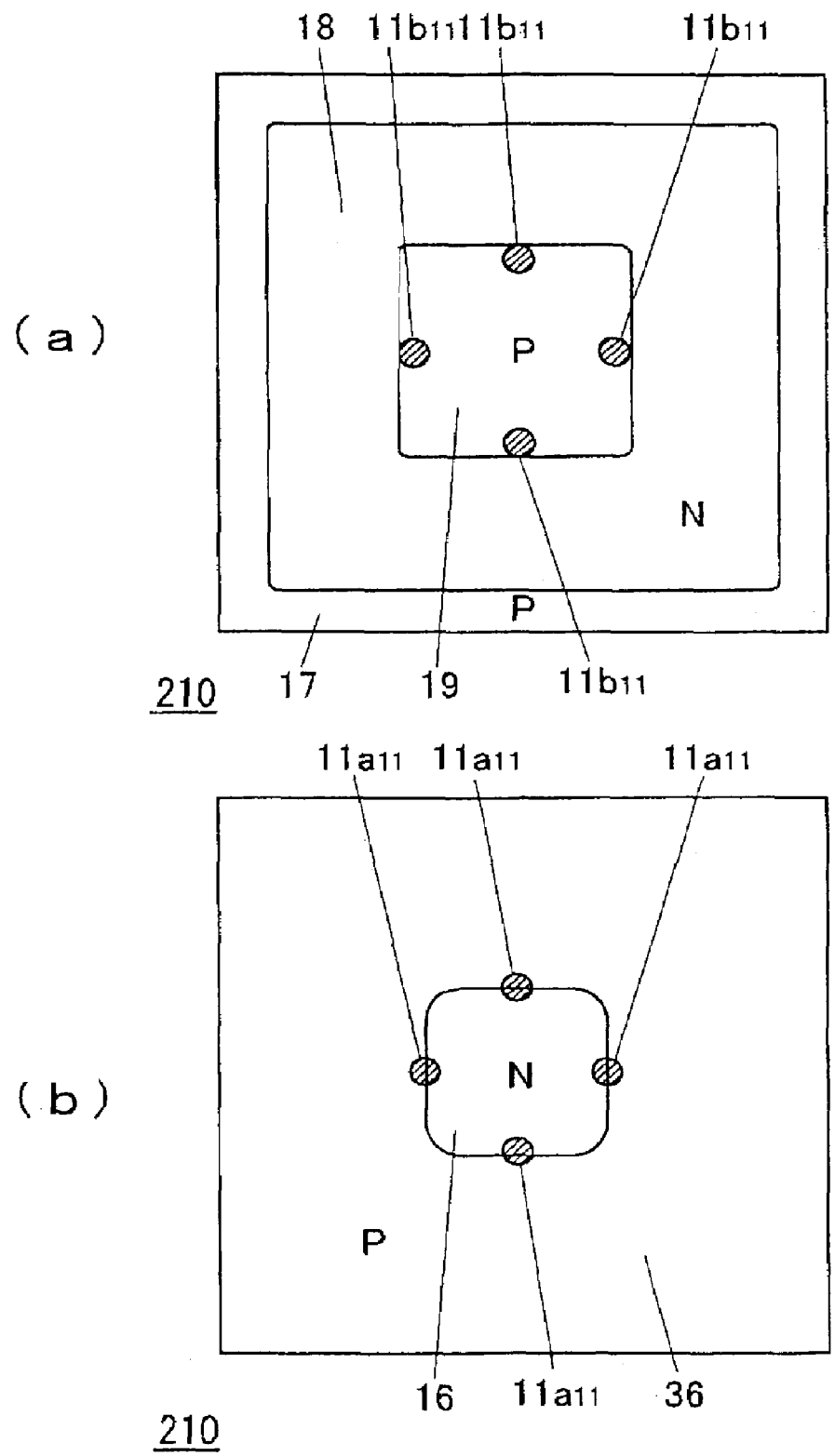
FIGS. 13(a) and 13(b) are planar views showing the semiconductor device according to the eleventh embodiment of the present invention, with FIG. 13(a) being a planar view of one surface and FIG. 13(b) being a planar view of another surface.

Next, a semiconductor device 210 according to an eleventh embodiment of the present invention is described. FIG. 12 is a cross-sectional view showing the semiconductor device 210 according to the eleventh embodiment of the present invention and FIGS. 13(a) and 13(b) are planar views showing the semiconductor device 210 according to the eleventh embodiment of the present invention. FIG. 13(a) is a planar view showing one surface (the first surface) of the semiconductor device 210 and FIG. 13(b) is a planar view showing another surface (the second surface) of the semiconductor device 210.

The semiconductor device 210 according to the eleventh embodiment differs from the semiconductor device 110 according to the first embodiment in the position at which the second P-type layer 19 is formed on the first surface and in the number and positions of the supports $11b_{11}$. While the second P-type layer 19 is formed off-center towards the side surface 22 of the semiconductor device 110 according to the first embodiment, the second P-type layer 19 in the semiconductor device 210 according to the eleventh embodiment is formed in a central part of the second N-type layer 18 formed in the semiconductor device 210. Also, while one support 11b is formed at the boundary of the second N-type layer 18 and the second P-type layer 19 in the semiconductor device 110 of the first embodiment, supports $11b_{11}$ in the semiconductor device 210 according to the eleventh embodiment are formed at four positions in a peripheral part of the second P-type layer 19.

In this case also, since there is little flow of current at the peripheral parts of the second P-type layer 19, the obstruction of the flow of current by the support $11b_{11}$ is very effectively suppressed.

In the semiconductor device 210 according to the eleventh embodiment, on the second surface also, supports $11a_{11}$ are formed at four positions in a boundary part between the first N-type layer 16 and a fourth P-type layer 36 formed in the peripheral part of the first N-type layer 16.

Since there is little flow of current at these parts, the obstruction of the flow of current by the support $11a_{11}$ is very effectively suppressed.

In the semiconductor device 210 according to the eleventh embodiment, the supports $11b_{11}$, $11a_{11}$ are formed as cylinders. Accordingly, the creation of voids can be effectively suppressed during the reflow process.

Twelfth Embodiment

Figure 14:
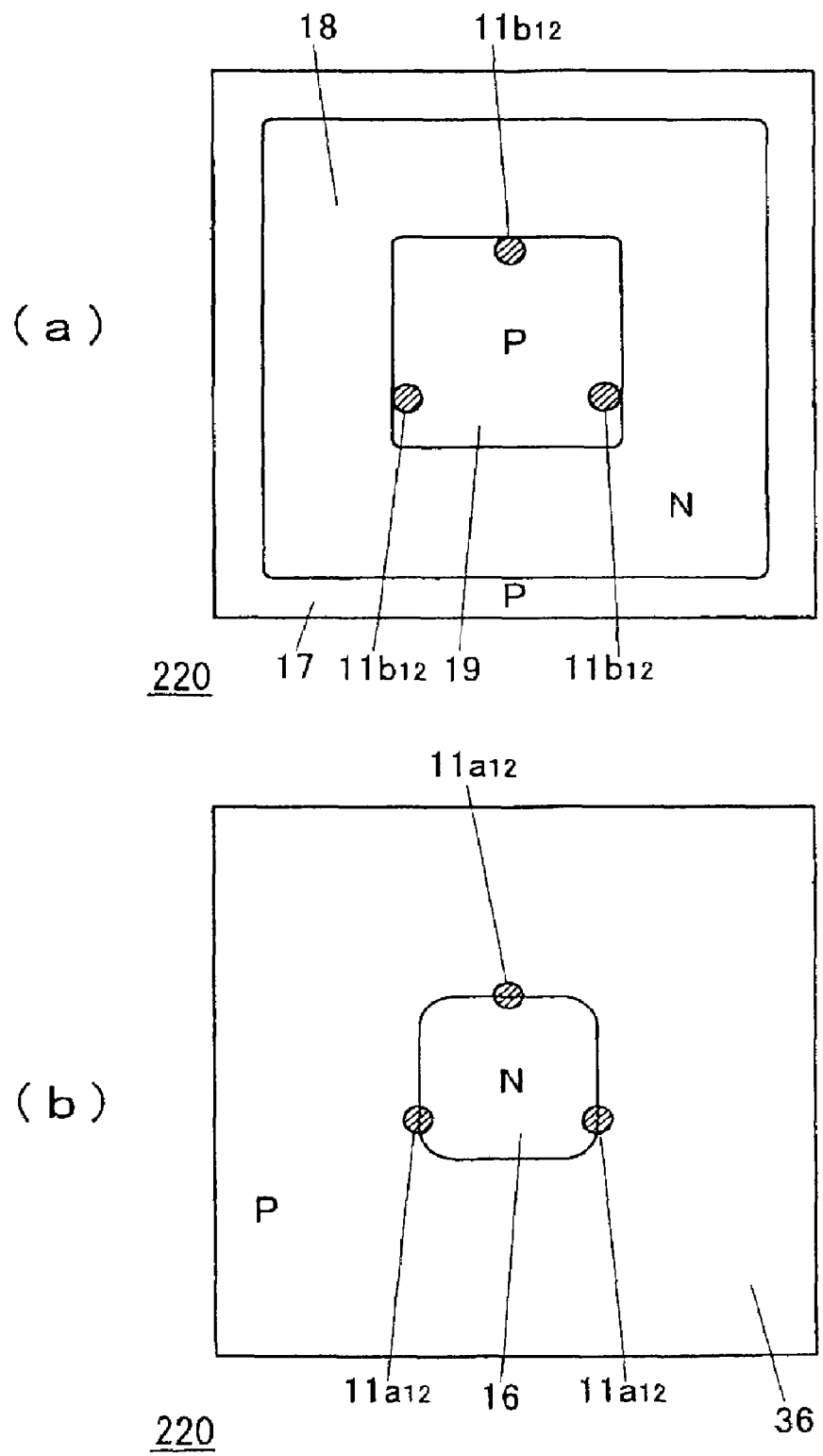
FIGS. 14(a) and 14(b) are planar views showing the semiconductor device according to the twelfth embodiment of the present invention, with FIG. 14(a) being a planar view of one surface and FIG. 14(b) being a planar view of another surface.

Next, a semiconductor device 220 according to a twelfth embodiment of the present invention is described. FIGS. 14(a) and 14(b) are planar views showing the semiconductor device 220 according to the twelfth embodiment of the present invention. FIG. 14(a) is a planar view showing one surface (the first surface) of the semiconductor device 220 and FIG. 13(b) is a planar view showing another surface (the second surface) of the semiconductor device 220.

The semiconductor device 220 according to the twelfth embodiment differs from the semiconductor device 210 according to the eleventh embodiment in the number of supports. While four supports are formed on each surface of the semiconductor device 210 according to the eleventh embodiment, three supports are formed on each surface of the semiconductor device 220 according to the twelfth embodiment.

While the number of supports used in the twelfth embodiment differs from that used in the eleventh embodiment, the same effects as the eleventh embodiment are obtained.

Thirteenth Embodiment

Figure 15:
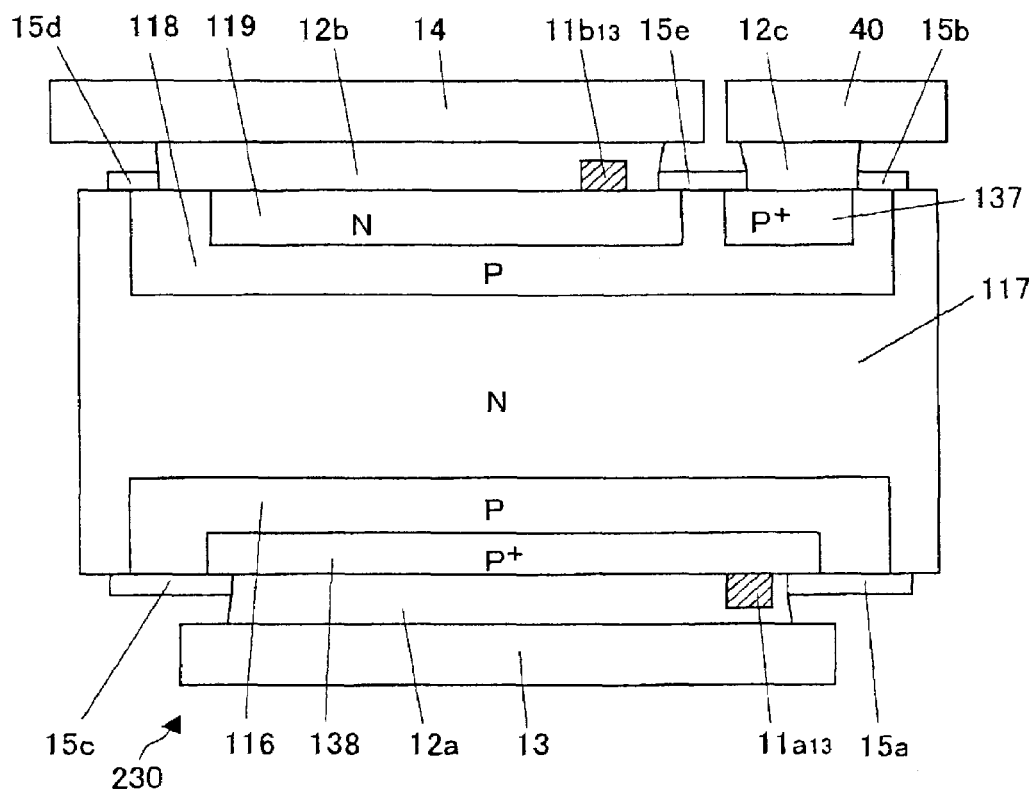
FIG. 15 is a cross-sectional view showing the semiconductor device according to the thirteenth embodiment of the present invention.
Figure 16:
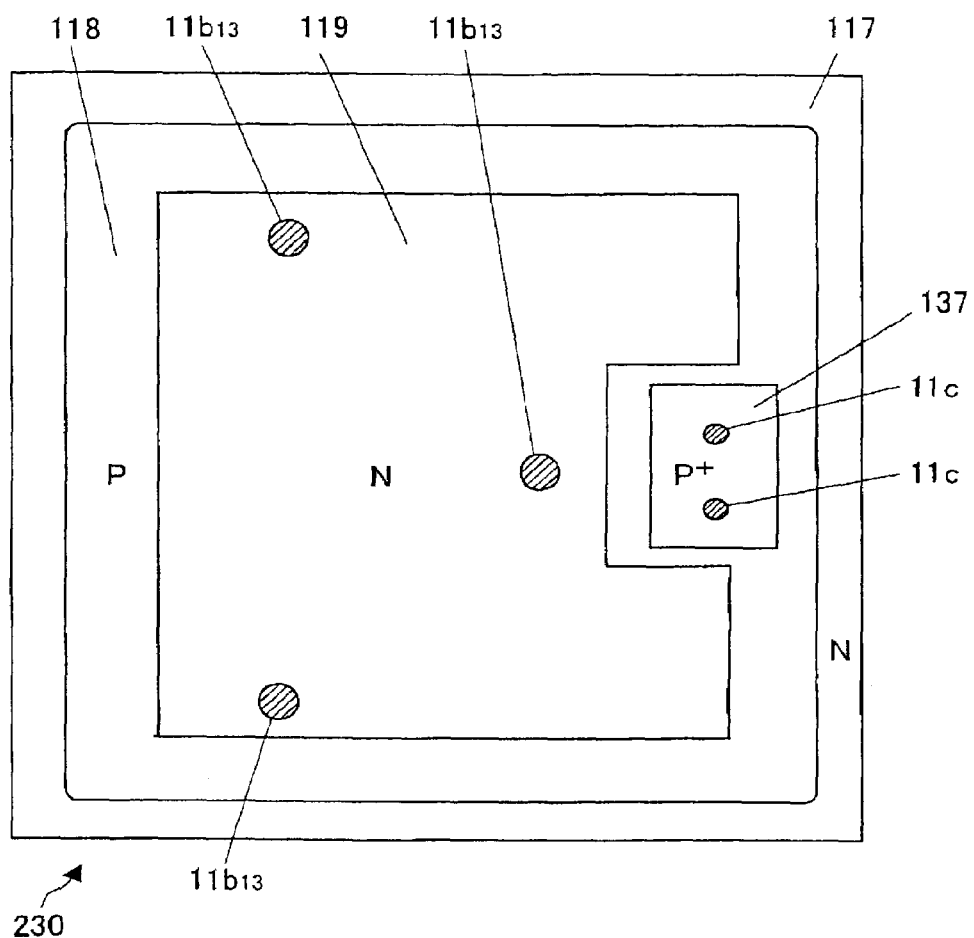
FIG. 16 is a planar view showing one surface of the semiconductor device according to the thirteenth embodiment of the present invention.
Figure 17:
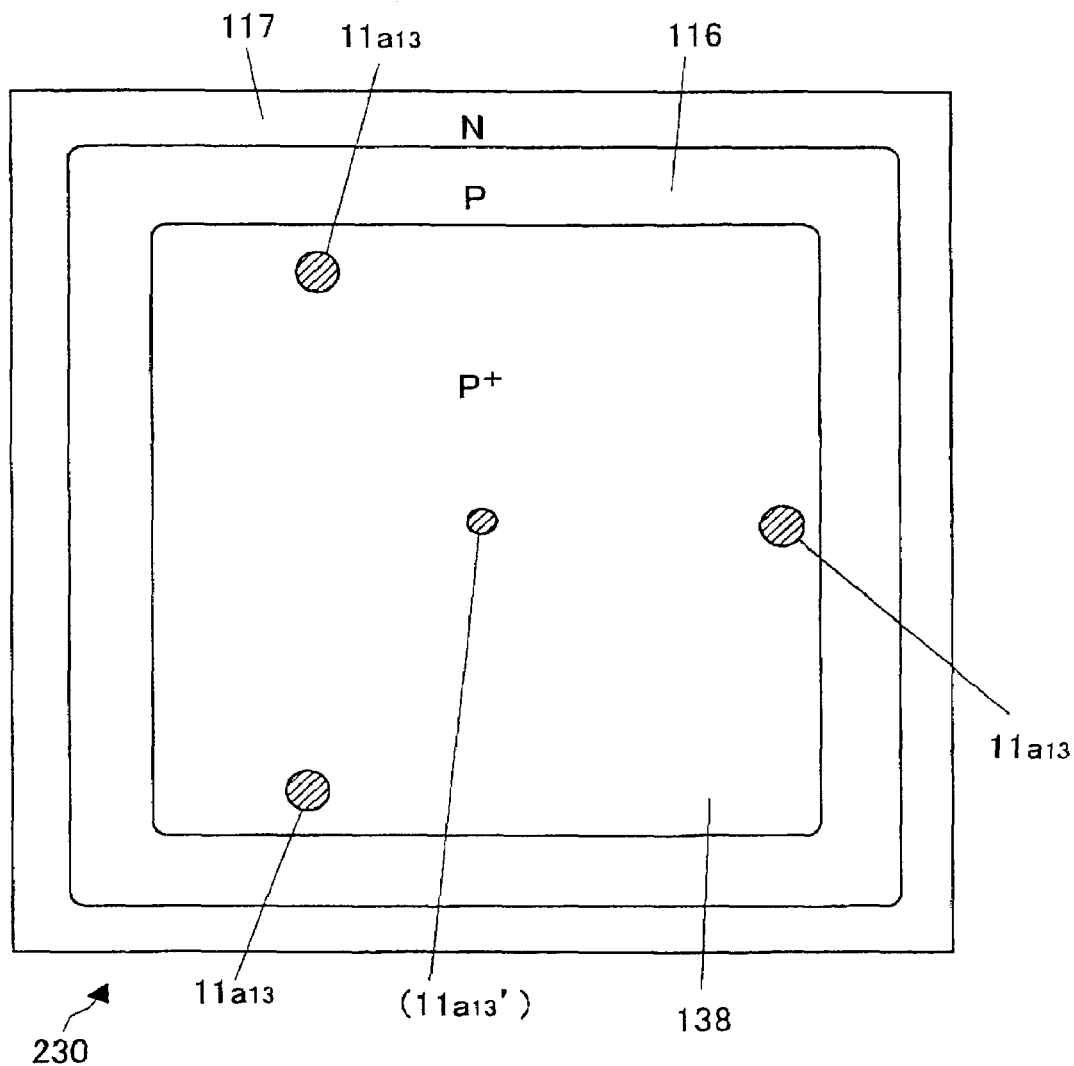
FIG. 17 is a planar view showing another surface of the semiconductor device according to the thirteenth embodiment of the present invention.

Next, a semiconductor device 230 according to a thirteenth embodiment of the present invention is described. FIG. 15 is a cross-sectional view of the semiconductor device 230 according to the thirteenth embodiment of the present invention, FIG. 16 is a planar view showing one surface (the first surface) of the semiconductor device 230, and FIG. 17 is a planar view showing another surface (the second surface) of the semiconductor device 230. It should be noted that as shown in FIG. 15, the conductivity of the substrate in the semiconductor device 230 according to the thirteenth embodiment is the reverse of that in the semiconductor device 110 according to the first embodiment.

The semiconductor device 230 according to the thirteenth embodiment differs from the semiconductor device 110 according to the first embodiment in the positions at which the supports are formed. This is to say, while the support 11$b$ is formed at the boundary between the second N-type layer 18 and the second P-type layer 19 in the semiconductor device 110 according to the first embodiment, a plurality of supports 11$b_{13}$ are formed at positions in a peripheral part of the second P-type layer 119 in the semiconductor device 230 according to the thirteenth embodiment. One of these supports is formed at a position on the second P-type layer 119 that faces a region 137 for providing a potential to the gate.

In this way, the supports 11$b_{13}$ are formed at different positions in the semiconductor device 230 according to the thirteenth embodiment to the semiconductor device 110 according to the first embodiment. Since there is little flow of current at these parts also, the obstruction of the flow of current by the supports 11$b_{13}$ is very effectively suppressed.

In the semiconductor device 230 according to the thirteenth embodiment, on the second surface also, a plurality of supports 11$a_{13}$ are formed at positions around a peripheral part of the third P-type layer 138 that is formed in the first P-type layer 116. In this way, the supports 11$a_{13}$ are formed at different positions in the semiconductor device 230 according to the thirteenth embodiment to the semiconductor device 110 according to the first embodiment. Since there is little flow of current at these parts also, the obstruction of the flow of current by the supports 11$a_{13}$ is very effectively suppressed.

It should be noted that a support is shown by the reference numeral (11$a_{13}$') in FIG. 17. In this way, supports which are formed with a small area so as to hardly obstruct the flow of current can be disposed in the third P-type layer 138.

In the semiconductor device 230 according to the thirteenth embodiment, two supports 1$c$ are also formed in a region 137 that supplies potential to the gate (see FIG. 16).

Fourteenth Embodiment

Figure 18:
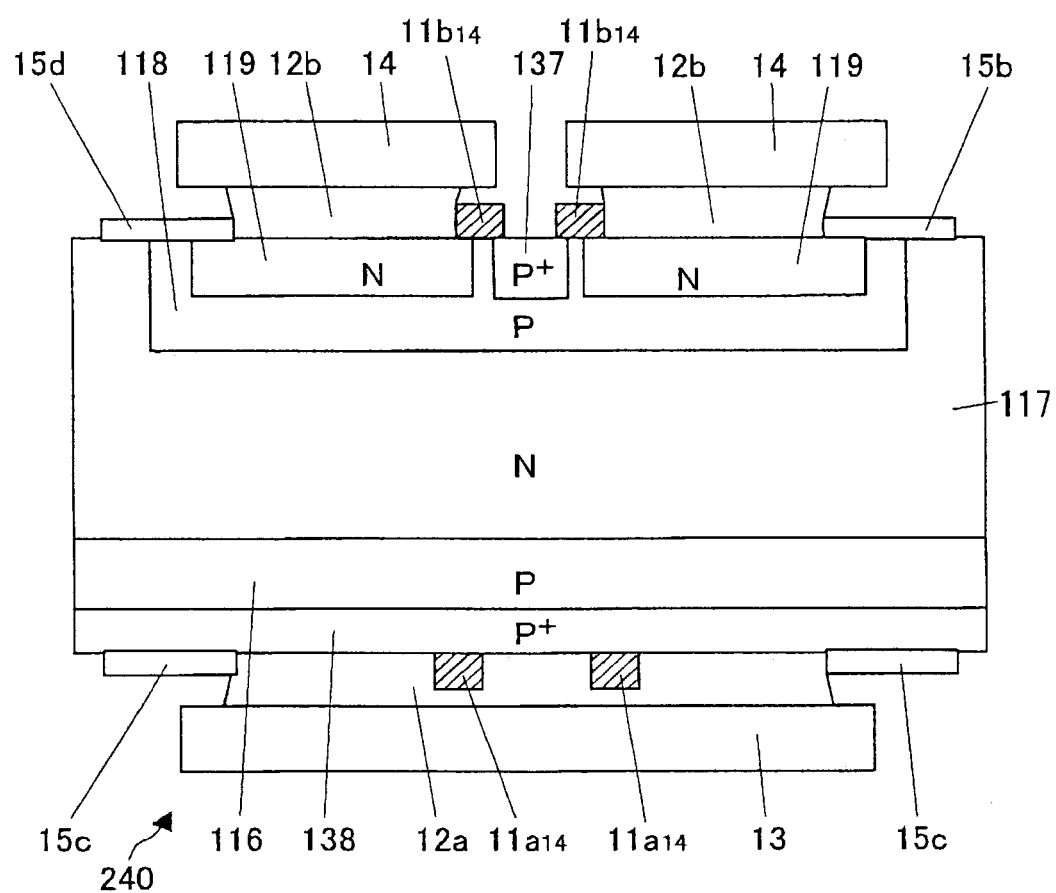
FIG. 18 is a cross-sectional view showing the semiconductor device according to the fourteenth embodiment of the present invention.

Next, a semiconductor device 240 according to a fourteenth embodiment of the present invention is described. FIG. 18 is a cross-sectional view of the semiconductor device 240 according to the fourteenth embodiment of the present invention.

The semiconductor device 240 according to the fourteenth embodiment differs from the semiconductor device 230 according to the thirteenth embodiment in the position at which the region 137 for supplying the gate potential is formed. While the region 137 for supplying the gate potential is formed in a peripheral part of the semiconductor device 230 according to the thirteenth embodiment, the region 137 for supplying the gate potential is formed in a central part of the semiconductor device 240 according to the fourteenth embodiment.

In this way, the region 137 for supplying the gate potential is formed at a different position in the semiconductor device 240 according to the fourteenth embodiment to the semiconductor device 230 according to the thirteenth embodiment, though in this case also, the supports 11$b_{14}$ are formed at a boundary part between the region 137 for supplying the gate potential and the second N-type layers 119, which is to say at a part where there is little flow of current, so that the obstruction of the flow of current by the supports is very effectively suppressed.

Fifteenth Embodiment

Figure 19:
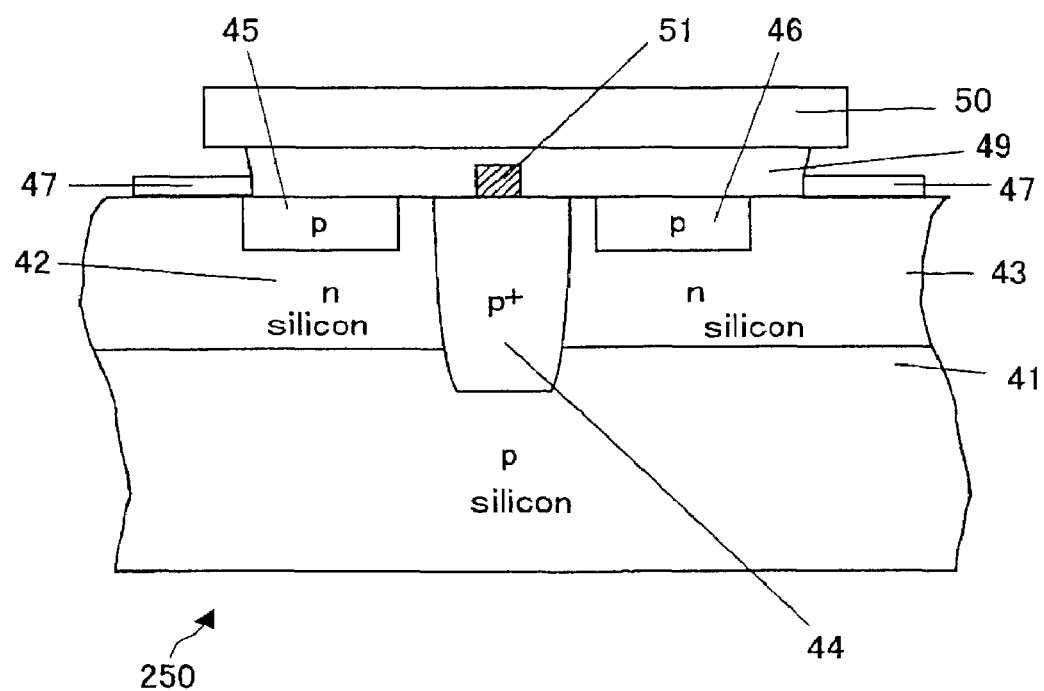
FIG. 19 is a cross-sectional view showing the semiconductor device according to the fifteenth embodiment of the present invention.

Next, a semiconductor device 250 according to a fifteenth embodiment of the present invention is described. FIG. 19 is a cross-sectional view of the semiconductor device 250 according to the fifteenth embodiment of the present invention.

The semiconductor device 250 according to the fifteenth embodiment has a plurality of regions that are electrically isolated on one surface of the semiconductor device 250. The semiconductor device 250 is characterized by having a support 51 provided on an element isolating region 44 that electrically isolates the plurality of regions.

When an electrode terminal 50 is connected to a conductive region of the semiconductor substrate via a conductive member 49, even if the electrode terminal 50 is displaced and tilted, a support 51 positioned below the electrode terminal 50 supports the electrode terminal 50, so that the tilting of the electrode terminal 50 can be suppressed to within a predetermined range. Even if there are warping and undulations in the silicon substrate, the electrode terminal 50 can be effectively prevented from being provided in a state where the electrode terminal 50 is in contact with the silicon substrate. Since little current flows on the element isolating region 44, the support 51 does not obstruct the flow of current.

Sixteenth Embodiment

Figure 20:
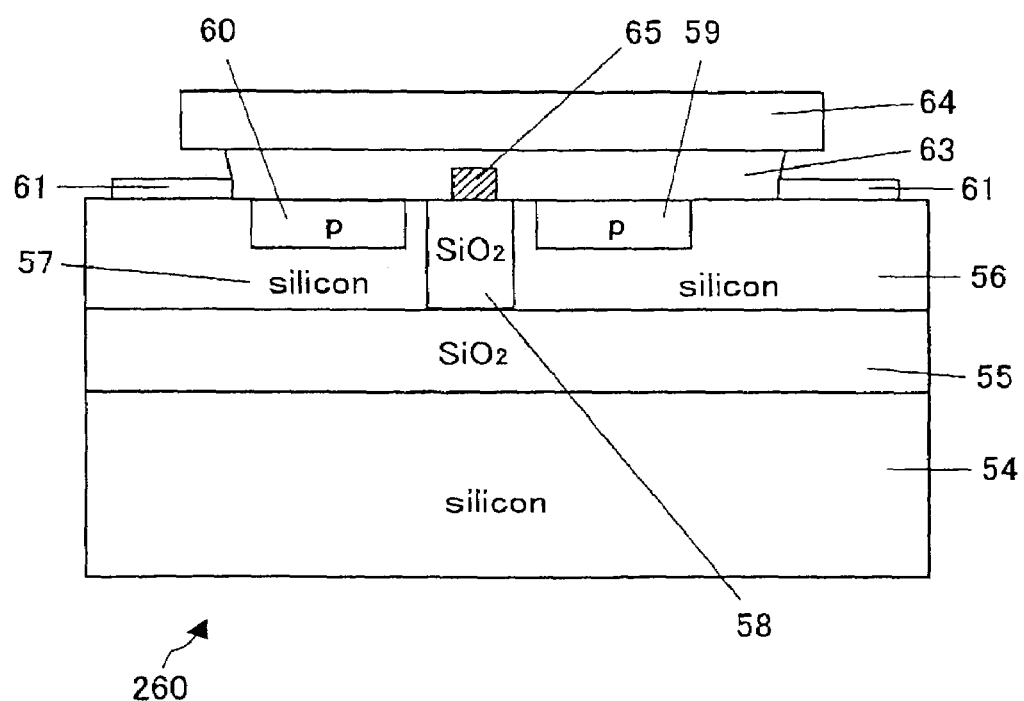
FIG. 20 is a cross-sectional view showing the semiconductor device according to the sixteenth embodiment of the present invention.

Next, a semiconductor device 260 according to a sixteenth embodiment of the present invention is described. FIG. 20 is a cross-sectional view of the semiconductor device 260 according to the sixteenth embodiment of the present invention.

As shown in FIG. 20, the semiconductor device 260 according to the sixteenth embodiment has fundamentally the same structure as the semiconductor device 250 according to the fifteenth embodiment. The semiconductor device 260 according to the sixteenth embodiment differs from the semiconductor device 250 according to the fifteenth embodiment in the structure of the element isolating construction. This is to say, while the element isolating structure in the semiconductor device 250 according to the fifteenth embodiment is the element isolating region 44 that is realized by a PN junction, the element isolating structure in the semiconductor device 260 according to the sixteenth embodiment is an element isolating structure 58 that is realized by burying a $SiO_2$ insulating film as far as the $SiO_2$ insulating layer 55 that is the I (Insulator) layer in an SOI (Silicon On Insulator) structure.

In this way, while the structure of the element isolating structure differs, the semiconductor device 260 according to the sixteenth embodiment of the present invention is similar to the semiconductor device 250 according to the fifteenth embodiment in that the support 65 is formed on the element isolating structure 58, so that the same effects are obtained as in the fifteenth embodiment.

Seventeenth Embodiment

Figure 21:
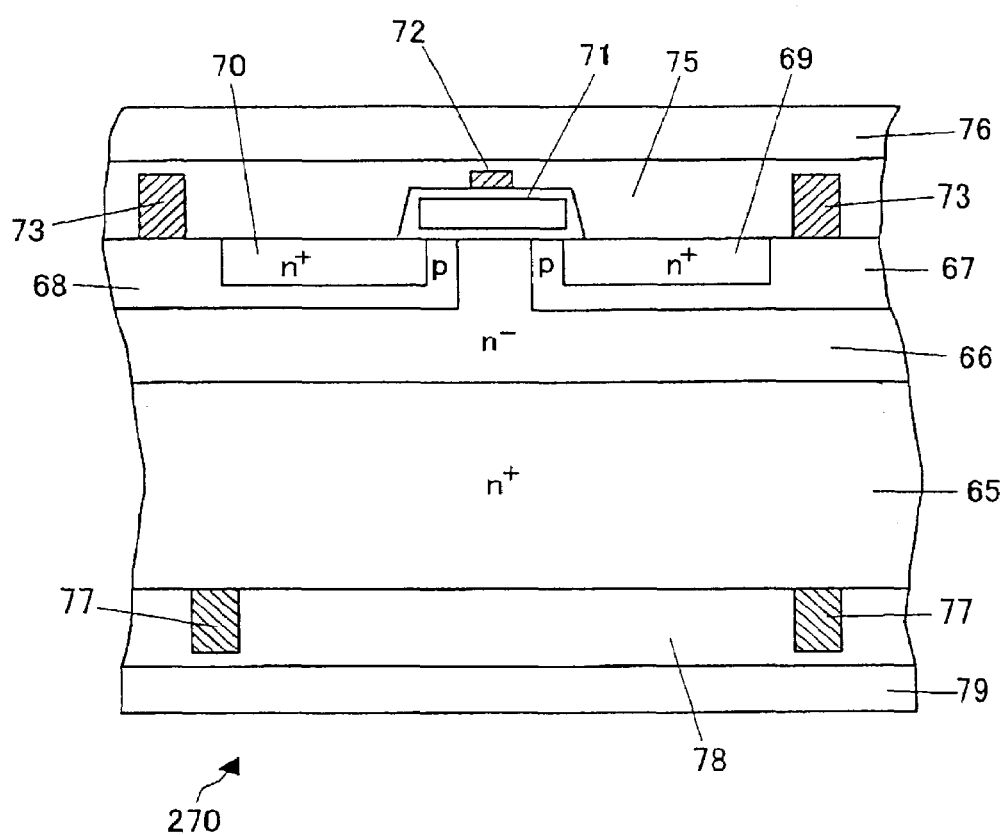
FIG. 21 is a cross-sectional view showing the semiconductor device according to the seventeenth embodiment of the present invention.

Next, a semiconductor device 270 according to a seventeenth embodiment of the present invention is described. FIG. 21 is a cross-sectional view of the semiconductor device 270 according to the seventeenth embodiment of the present invention. As shown in FIG. 21, the semiconductor device 270 according to the seventeenth embodiment is a power control semiconductor device with an insulated gate transistor, which switches a current flowing in the thickness direction of the semiconductor device, formed on one surface of the semiconductor substrate.

In a semiconductor device with the above structure, a support 72 is provided on a gate electrode 71 of the insulated gate transistor via an insulating film, and by providing supports 73 on the P wells 67, 68 in which source regions 69, 70 are formed, the following effects can be obtained.

Even if an electrode terminal 76 is displaced and tilted when the electrode terminal 76 is connected to the conductive regions via a conductive member 75, the supports 72, 73 positioned below the electrode terminal 76 support the electrode terminal 76, so that the tilting of the electrode terminal 76 can be suppressed to within a predetermined range. Also, even if there are warping and undulations in the silicon substrate, the electrode terminal 76 can be effectively prevented from being provided in a state where the electrode terminal 76 is in contact with the silicon substrate. Since little current flows at an insulated gate, the support 72 does not obstruct the flow of current. The P wells 67, 68 each have a relatively large area, and by forming the supports 73 in parts of the P wells 67, 68 where little current flows, the supports 73 can be prevented from obstructing the flow of current.

It should be noted that in the seventeenth embodiment, the supports 73 are provided on P wells, though if there is a region where there is little flow of current, the supports 73 may be favorably provided in such region instead. As one example, the supports 73 may be provided on a non-active region of the semiconductor substrate.

By providing supports 77 on a drain region 65 that is provided on the other surface of the semiconductor device 270, the following effects are obtained.

Even if an electrode terminal 79 is displaced and tilted when the electrode terminal 79 is connected to a conductive region 65 via a conductive member 78, the support 77 positioned below the electrode terminal 79 supports the electrode terminal 79, so that the tilting of the electrode terminal 79 can be suppressed to within a predetermined range. Even if there are warping and undulations in the silicon substrate, the electrode terminal 79 can be effectively prevented from being provided in a state where the electrode terminal 79 is in contact with the silicon substrate.

Eighteenth Embodiment

Figure 22:
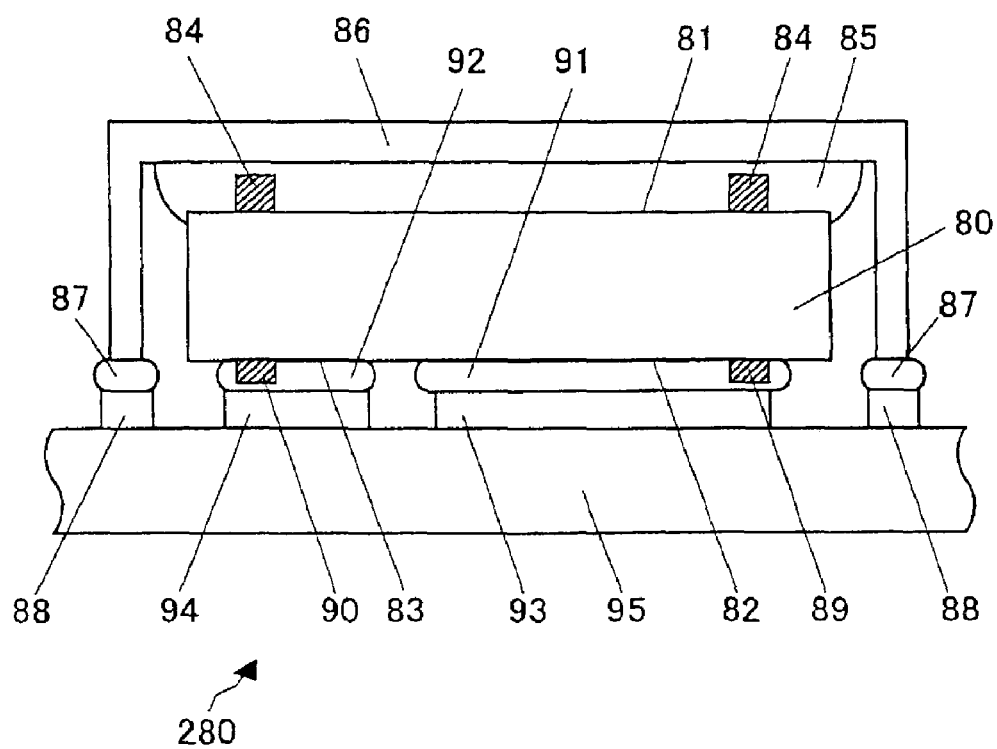
FIG. 22 is a cross-sectional view showing the semiconductor device according to the eighteenth embodiment of the present invention.

Next, a semiconductor device 280 according to an eighteenth embodiment of the present invention is described. FIG. 22 is a cross-sectional view of the semiconductor device 280 according to the eighteenth embodiment of the present invention. As shown in FIG. 22, the semiconductor device 280 according to the eighteenth embodiment is a power control semiconductor device where a semiconductor substrate 80 is mounted on a printed circuit board 95.

In this semiconductor device 280, a drain electrode part 81 formed in the semiconductor substrate 80 is connected to a drain metal electrode 86 via a conductive adhesive 85. The drain metal electrode 86 is connected to a drain electrode part 88 of the printed circuit board 95 via solder 87. A source electrode part 82 formed in the semiconductor substrate 80 is connected to a source electrode part 93 of the printed circuit board 95 via solder 91. A gate electrode part 83 formed in the semiconductor substrate 80 is connected to a gate electrode part 94 of the printed circuit board 95 via solder 92.

In this semiconductor device 280 also, supports (in FIG. 22, supports 84 in a region in which the drain electrode part 81 is formed, a support 89 in a region in which the source electrode part 82 is formed, and a support 90 in a region in which the gate electrode part 83 is formed) are provided at positions where the flow of current on the semiconductor substrate 80 is not obstructed, so that the following effects are obtained.

This is to say, when a reflow process is performed, even if the semiconductor substrate 80 is tilted when the semiconductor substrate 80 is set on the printed circuit board 95, or if the drain metal electrode 86 is tilted when the drain metal electrode 86 is set on the semiconductor substrate 80, the presence of the supports 84, 89, 90 means that the tilting of the printed circuit board 95 and the semiconductor substrate 80 and the tilting of the semiconductor substrate 80 and the drain metal electrode 86 can be suppressed within predetermined ranges. Even if there are warping and undulations in the silicon substrate and/or the printed circuit board 95, the source electrode part 93 on the printed circuit board 95, the gate electrode part 94 on the printed circuit board 95, and the drain metal electrode 86 can be effectively prevented from being provided in a state where these parts are in contact with the semiconductor substrate 80.

Nineteenth Embodiment

Figure 23:
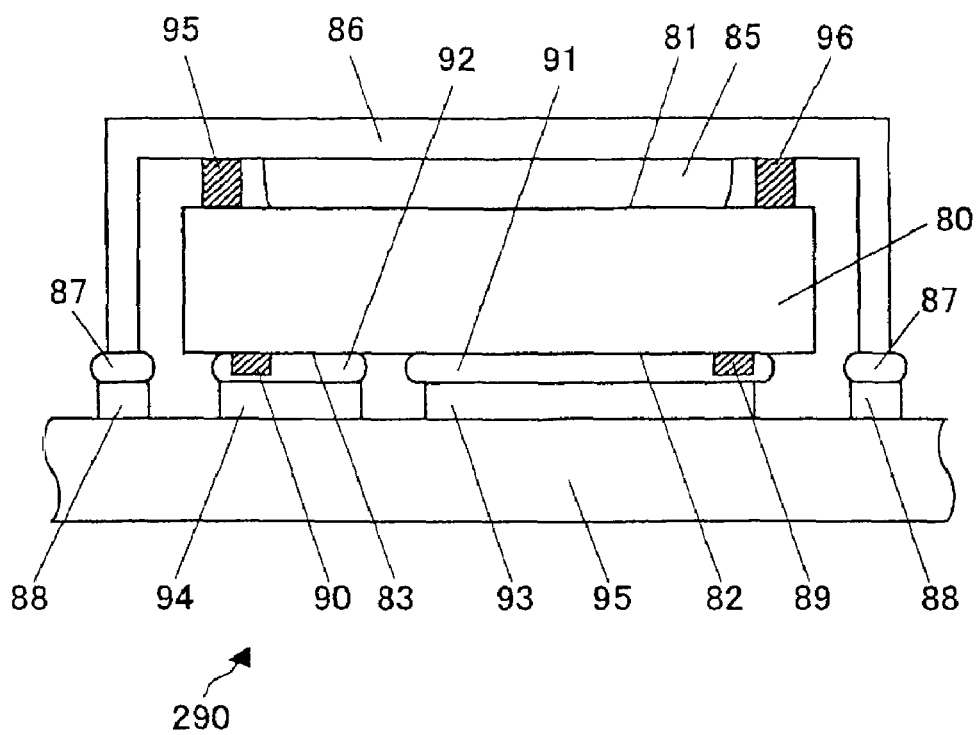
FIG. 23 is a cross-sectional view showing the semiconductor device according to the nineteenth embodiment of the present invention.

Next, a semiconductor device 290 according to a nineteenth embodiment of the present invention is described. FIG. 23 is a cross-sectional view of the semiconductor device 290 according to the nineteenth embodiment of the present invention. As shown in FIG. 23, the semiconductor device 290 according to the nineteenth embodiment is a power control semiconductor device 290 where the semiconductor substrate 80 is mounted on a printed circuit board 95.

The semiconductor device 290 according to the nineteenth embodiment differs from the semiconductor device 280 according to the eighteenth embodiment in the structure of the support. In the semiconductor device 280 according to the eighteenth embodiment, the support 84 is formed so as to be thinner than the thickness of the conductive adhesive 85, and when as a result the drain metal electrode 86 is correctly set on the semiconductor substrate 80, the support 84 and the drain metal electrode 86 do not come into contact. Conversely, in the semiconductor device 290 according to the nineteenth embodiment, the support 96 and the drain metal electrode 86 are always in contact. Putting this another way, in the semiconductor device 290 according to the nineteenth embodiment, the support 96 functions as a spacer between the semiconductor substrate 80 and the drain metal electrode 86.

In this semiconductor device 290, the drain metal electrode 86 is provided so as to face one surface of the semiconductor substrate 80 with the support 96 in between as a spacer, so that when the reflow process is performed, there is the effect that the drain metal electrode 86 is not attached to the semiconductor substrate 80 in a tilted state.

Twentieth Embodiment

Figure 24:
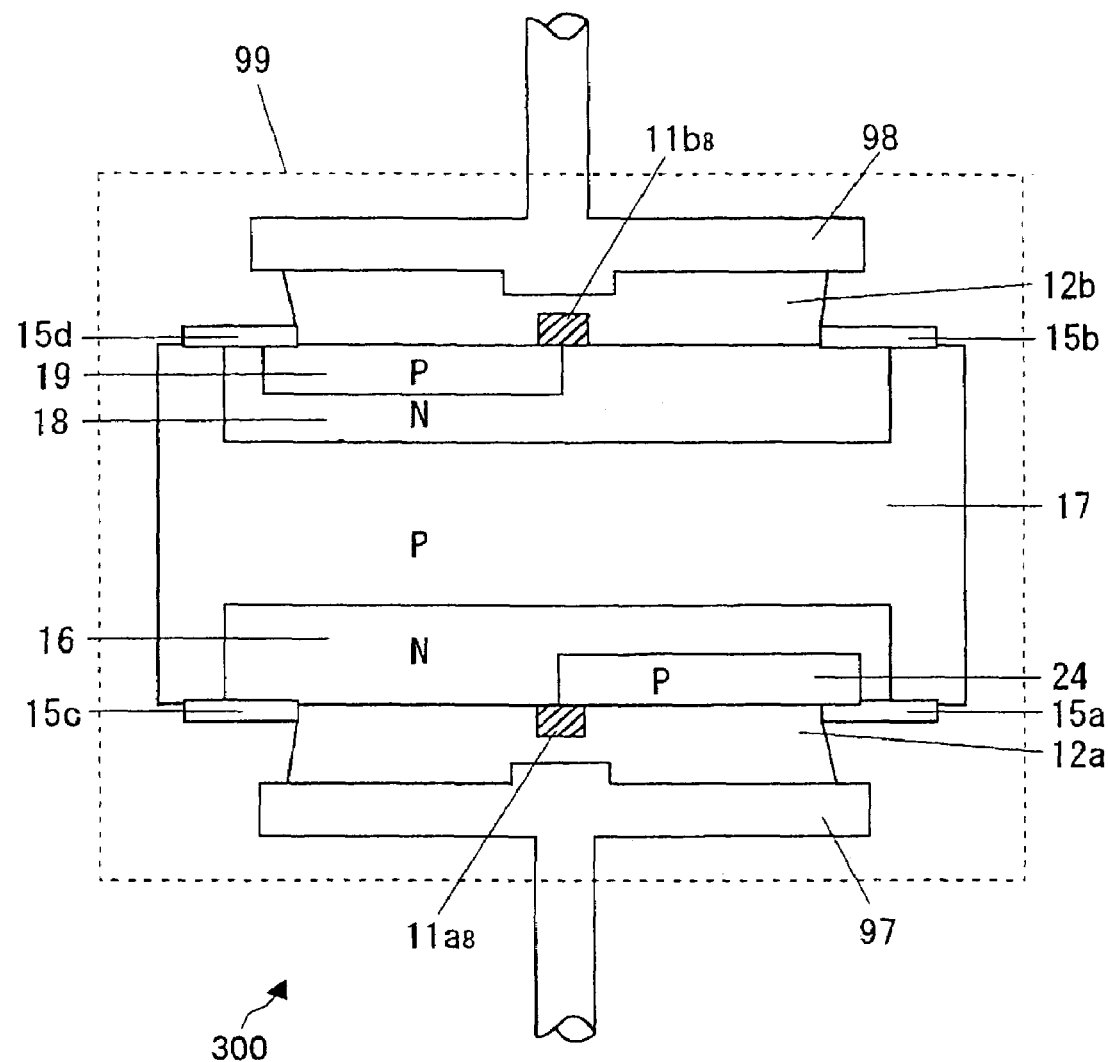
FIG. 24 is a cross-sectional view showing the semiconductor device according to the twentieth embodiment of the present invention.

Next, a semiconductor device 300 according to a twentieth embodiment of the present invention is described. FIG. 24 is a cross-sectional view of the semiconductor device 300 according to the twentieth embodiment of the present invention.

The semiconductor device 300 according to the twentieth embodiment resembles the semiconductor device 180 according to the eighth embodiment. The semiconductor device 300 according to the twentieth embodiment differs from the semiconductor device 180 according to the eighth embodiment in the structure of the electrode terminals. While the electrode terminals 13, 14 are in the form of flat plates in the semiconductor device 180 according to the eighth embodiment, electrode terminals 97, 98 in the semiconductor device 300 according to the twentieth embodiment have a convex part formed on an inner surface and also have lead wires attached to them.

This semiconductor device 300 also realizes the same effects as the semiconductor device 180 according to the eighth embodiment.

Twenty-First Embodiment

Figure 25:
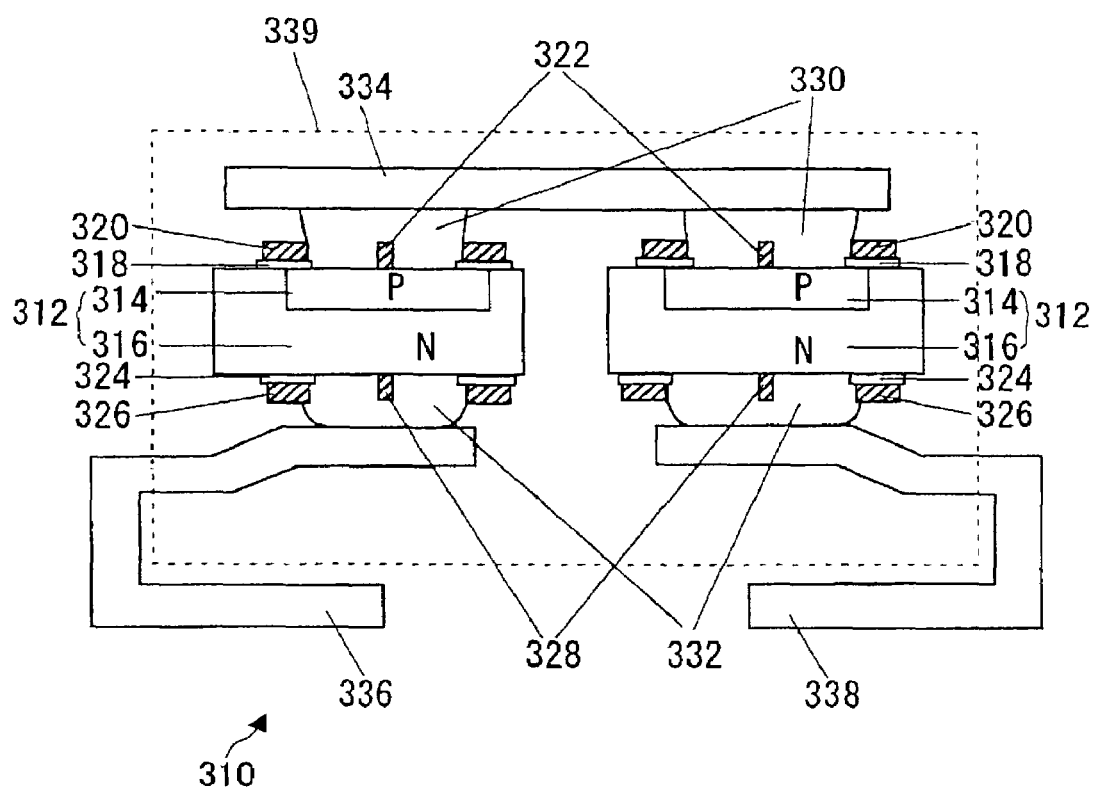
FIG. 25 is a cross-sectional view showing the semiconductor device according to the twenty-first embodiment of the present invention.
Figure 26:
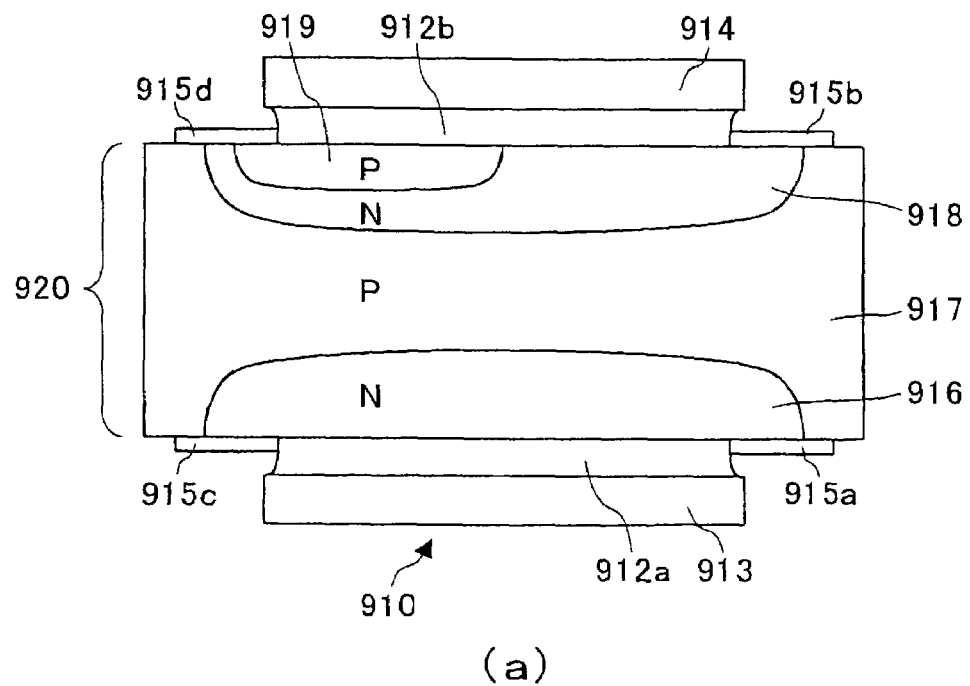
FIGS. 26(a) and 26(b) are cross-sectional views showing a thyristor-type semiconductor device according to the related art, with FIG. 26(a) being a cross-sectional view of a semiconductor device in which the electrode terminals are correctly provided and FIG. 26(b) being a cross-sectional view of a semiconductor device in which one electrode terminal is in contact with the silicon substrate.
Figure 26:
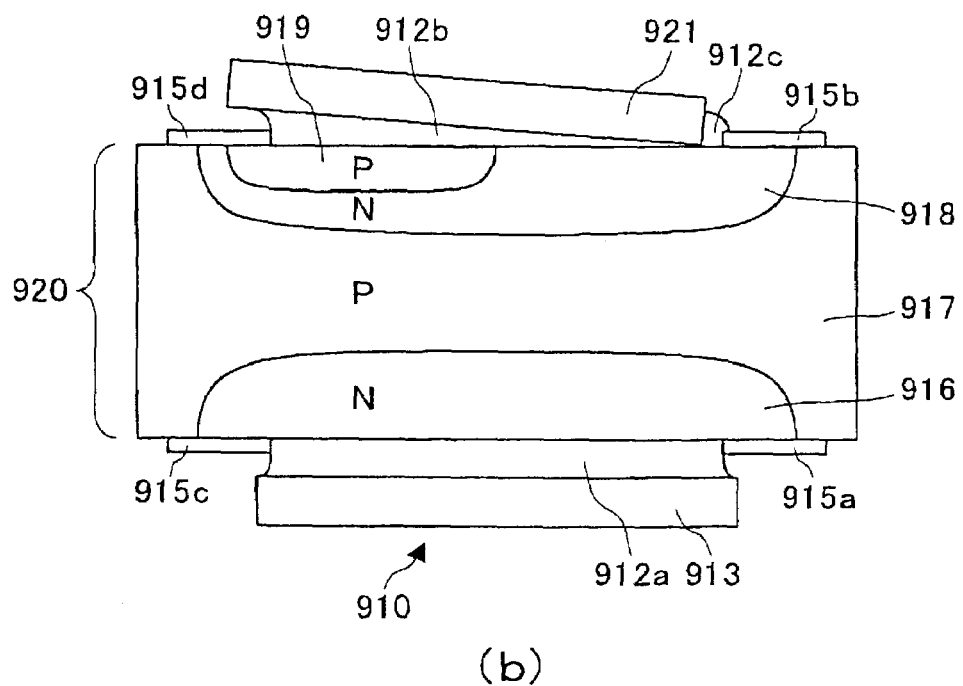

Next, a semiconductor device 310 according to a twenty-first embodiment of the present invention is described. FIG. 25 is a cross-sectional view of the semiconductor device 310 according to the twenty-first embodiment of the present invention. As shown in FIG. 25, the semiconductor device 310 according to the twenty-first embodiment is a surface-mounted semiconductor device 310.

In this semiconductor device 310, two semiconductor substrates 312 which have a PN diode structure with a P-type region 314 formed in an N-type region 316, are connected in series with opposite orientations and are molded using a resin mold 339. P-type regions 314 of the two semiconductor substrates 312 are connected to each other via solder 330 and a metal electrode 334. N-type regions 316 of the two semiconductor substrates 312 are each connected via solder 332 to separate metal electrodes 336, 338, respectively.

In the semiconductor device 310 according to the twenty-first embodiment, supports 322 are formed on the surfaces of the P-type regions 314 and supports 328 are formed on the surfaces of the N-type region 316. For this reason, when a reflow process is performed with the semiconductor substrates 312, the metal electrode 334, and the metal electrodes 336, 338 having been arranged with a predetermined positional relationship, even if the semiconductor substrates 312 and the metal electrode 334 are tilted, or if the semiconductor substrates 312 and the metal electrodes 336, 338 are tilted, the presence of the supports 322, 328 makes it possible to suppress the tilting of the semiconductor substrates 312 and the metal electrode 334 and the tilting of the semiconductor substrates 312 and the metal electrodes 336, 338 to within predetermined ranges. Even if there are warping and undulations in the silicon substrates 312 and/or metal electrodes 334, 336, 338, the metal electrodes 334, 336, 338 can be effectively prevented from being provided in a state where these parts are in contact with the silicon substrates 312.

It should be noted that in the above embodiments, instead of solder, the electrode terminals can be attached using other conductive materials, such as conductive adhesive. When conductive adhesive or the like is used, it is possible to absorb stress in the conductive material and to attach the electrode terminals at low temperatures. The supports may be attached to the silicon substrate using adhesive. Here, it is preferable to use an isotropic conductive adhesive, an anisotropic conductive adhesive, a thermoresistant adhesive, and a recyclable adhesive or the like as the adhesive. It is also preferable to use a material whose thermal expansion coefficient is close to that of the silicon substrate as the glass material used for the supports, with it also being preferable to use a material with favorable thermal shock resistance, firing temperature, electrical characteristics, electrical charge in glass, and adhesion. In addition, it is preferable to use a material that does not include impurities, such as alkali components that adversely affect the surfaces of semiconductor elements. It is also preferable to use a material with superior tensile strength, mass-producibility, and resistance to cracking. The supports may also be made from an environmentally-friendly material. As one example, lead-free glass may be used preferably.

As described above, the present invention has supports provided on silicon substrates or electrode terminals, so that when electrode terminals are provided on a silicon substrate, the electrode terminals can be prevented from being provided in a state where the electrode terminals are in contact with the silicon substrate. Even if there are warping and undulations in the surface of the silicon substrate, the electrode terminal can be prevented from being provided in a state where the electrode terminal is in contact with the silicon substrate.

INDUSTRIAL APPLICABILITY

The semiconductor device of the present invention has supports formed on the semiconductor substrate or on the electrode terminals, so that even when conventional manufacturing equipment is used to attach the electrode terminals, it is possible to prevent the electrode terminals from being attached to the semiconductor substrate in a significantly tilted state, with it also being possible to prevent the electrode terminals from being attached in a state where the electrode terminals are in contact with the semiconductor substrate, even when there are warping and undulations in the semiconductor substrate. With the semiconductor device of the present invention, the supports can be formed at positions (such as above a PN junction) where little current flows. As a result, power semiconductor devices that have a PN junction such as thyristors, triacs, diodes, MOSFETs, IGBTs and GTOs can be manufactured with a high yield with no loss in the performance of the semiconductor devices.

The invention claimed is:

1. A semiconductor device comprising:
   a first conductive region of a first type of conductivity that is formed so as to be exposed to a first surface of a semiconductor substrate;

a second conductive region of a second type of conductivity, which is an inverse of the first type of conductivity, that is formed so as to be exposed to the first surface of the semiconductor substrate;

an electrically conductive material that is provided on the first conductive region and the second conductive region;

an electrode terminal that is provided on the electrically conductive material; and a support that projects from the first surface at a position at or near a boundary between the first conductive region and the second conductive region where the conductive material is provided, wherein the support does not contact the electrode terminal.

2. A semiconductor device according to claim 1, further comprising an insulating film provided at or near an edge of the first conductive region, wherein the support is formed so that a top end of the support is positioned above a top end of the insulating film but below a top end of the electrically conductive material.

3. A semiconductor device according to claim 1, wherein the support is made of a glass material.

4. A semiconductor device according to claim 2, wherein the support has a multilayer structure including a layer of glass material and a film made of the same material as the insulating film.

5. A semiconductor device according to claim 1, wherein the support has a multilayer structure including a layer of glass material and a film made of adhesive.

6. A semiconductor device according to claim 2, wherein the support is formed of the same material as the insulating film.

7. A semiconductor device according to claim 1, wherein the support is at least 10 μm thick.

8. A semiconductor device according to claim 1, wherein the second conductive region is formed in an off-center position that is displaced towards one edge of the first conductive region, and the support is formed at or near the boundary on an opposite side to the edge towards which the second conductive region is formed.

9. A semiconductor device according to claim 1, wherein a plurality of second conductive regions are formed inside the first conductive region, and the support is provided in or near a region that faces the plurality of second conductive regions.

10. A semiconductor device according to claim 1, wherein the second conductive region is formed in a central part of the first conductive region, and a plurality of supports are provided in a periphery of the second conductive region.

11. A semiconductor device according to claim 1, further comprising a region for providing a gate potential inside the first conductive region, the support being provided at or near a region where the region for providing the gate potential and the second conductive region face one another.

12. A semiconductor device according to claim 1, further comprising another support that projects from a second surface of the semiconductor substrate, another conductive material that is provided on the second surface, and another electrode terminal that is provided on the second conductive material.

13. A semiconductor device comprising:

a first conductive region of a first type of conductivity that is formed so as to be exposed to a first surface of a semiconductor substrate;

a second conductive region of a second type of conductivity, which is an inverse of the first type of conductivity, that is formed so as to be exposed to the first surface of the semiconductor substrate;

an electrically conductive material that is provided on the first conductive region and the second conductive region;

an electrode terminal that is provided on the electrically conductive material; and a support that projects from a surface of the electrode terminal at a position that is opposite a position at or near a boundary between the first conductive region and the second conductive region, wherein the support does not contact the electrode terminal.

14. A semiconductor device, comprising:

a plurality of regions that are electrically isolated from one another on one surface of a semiconductor substrate;

an element isolating region for electrically isolating the plurality of regions;

an electrically conductive material that is provided on a upper surface of the plurality of regions and the element isolating region;

an electrode terminal that is provided on the electrically conductive material; and a support that projects from the surface on an element isolating region, wherein the support does not contact the electrode terminal.

15. A semiconductor device, comprising:

a well that is provided on one surface of a semiconductor substrate;

an insulated gate transistor that performs switching for a current flowing in a thickness direction of the semiconductor substrate;

an electrically conductive material that is provided on a upper surface of the well and the insulated gate transistor;

an electrode terminal that is provided on the electrically conductive material;

a first support that is provided on a gate electrode of the insulated gate transistor via an insulating film;

a second support that is formed on the wells, wherein the first support and the second support do not contact the electrode terminal.

16. A power control semiconductor device, comprising:

a printed circuit board;

a semiconductor substrate that is disposed on the printed circuit board; and a metal electrode that is disposed on the semiconductor substrate, wherein a first conductive region formed on a first surface of the semiconductor substrate is connected to an electrode part on a surface of the printed circuit board via a first electrically conductive material, wherein a second conductive region formed on a second surface of the semiconductor substrate is connected to the metal electrode via a second electrically conductive material, and supports that project outwards are provided on the first and second conductive regions of the semiconductor device wherein said supports do not make contact with at least one of the electrode part in the first conductive region and the metal electrode in the second conductive region.

17. A power control semiconductor device, comprising:
two semiconductor substrates that include diodes;
a common electrode to which a first surface of each of the two semiconductor substrates is commonly connected; and
first and second electrode terminals to which a second surface of each of the two semiconductor substrates is respectively connected,
wherein conductive regions formed on the first surfaces of the two semiconductor substrates are connected to the common electrode via a first conductive material, and conductive regions formed on the second surfaces of the two semiconductor substrates are connected to the first and second electrode terminals via second conductive materials, and
supports that project outwards are provided on each of the first surfaces and the second surfaces of the two semiconductor substrates.

18. A method of manufacturing a semiconductor device, comprising the following steps in the stated order:
manufacturing a semiconductor substrate that has a first surface and a second surface;
forming a support that projects from the first surface of the semiconductor substrate on the first surface;
applying an electrically conductive material onto the first surface with a greater thickness than the support; and
performing a reflow process with an electrode terminal having been mounted on the conductive region so as to electrically connect a predetermined conductive region provided on the first surface with the electrode terminal, wherein the support does not make contact with the electrode terminal.

19. A method of manufacturing a semiconductor device, comprising the following steps in the stated order:
manufacturing a semiconductor substrate that has a first surface and a second surface;
forming a first support that projects from the first surface of the semiconductor substrate on the first surface and a second support that projects from the second surface of the semiconductor substrate on the second surface;
applying a first electrically conductive material onto the first surface with a greater thickness than the first support and applying a second electrically conductive material onto the second surface with a greater thickness than the second support; and
performing a reflow process, with a first electrode terminal having been mounted on the first electrically conductive material and a second electrode terminal having been mounted on the second electrically conductive material, so as to electrically connect a predetermined conductive region provided on the first surface with the first electrode terminal and a predetermined electrically conductive region provided on the second surface with the second electrode terminal.

20. A method of manufacturing a semiconductor device, comprising the following steps in the stated order:
forming a first conductive region that has a first type of conductivity, with the first conductive region being exposed to a first surface of a semiconductor substrate;
forming a second conductive region that has a second type of conductivity, which is an inverse of the first type of conductivity, inside the first conductive region with the second conductive region being exposed to the first surface;

forming a support that projects from the first surface at or near a boundary between the first conductive region and the second conductive region;
applying an electrically conductive material onto the first conductive region and the second conductive region of the semiconductor device with a greater thickness than the support; and
performing a reflow process, with an electrode terminal having been mounted on the electrically conductive material so as to electrically connect the first and second conductive regions with the electrode terminal.

21. A method of manufacturing a semiconductor device, comprising the following steps in the stated order:
forming a first conductive region that has a first type of conductivity, with the first conductive region being exposed to a first surface of a semiconductor substrate;
forming a second conductive region that has a second type of conductivity, which is an inverse of the first type of conductivity, inside the first conductive region with the second conductive region being exposed to the first surface; forming an insulating film at or near an edge of the first conductive region,
forming a support that projects from the first surface at or near a boundary between the first conductive region and the second conductive region;
wherein the step of forming the support forms the support so that a top end of the support is positioned above a top end of the insulating film;
applying a conductive material onto the first conductive region and the second conductive region of the semiconductor device with a greater thickness than the support; and
performing a reflow process, with an electrode terminal having been mounted on the conductive material so as to electrically connect the first and second conductive regions with the electrode terminal.

22. A method of manufacturing a semiconductor device, comprising the following steps in the stated order:
forming a first conductive region that has a first type of conductivity, with the first conductive region being exposed to a first surface of a semiconductor substrate;
forming a second conductive region that has a second type of conductivity, which is an inverse of the first type of conductivity, inside the first conductive region with the second conductive region being exposed to the first surface;
forming an insulating film at or near an edge of the first conductive region and at or near the boundary between the first conductive region and the second conductive region,
forming a support that projects from the first surface at or near a boundary between the first conductive region and the second conductive region; wherein the support forms a glass layer on the insulating film formed at or near the boundary between the first conductive region and the second conductive regions;
applying a conductive material onto the first conductive region and the second conductive region of the semiconductor device with a greater thickness than the support; and
performing a reflow process, with an electrode terminal having been mounted on the conductive material so as to electrically connect the first and second conductive regions with the electrode terminal.

23. A method of manufacturing a semiconductor device, comprising the following steps in the stated order:

forming a first conductive region that has a first type of conductivity, with the first conductive region being exposed to a first surface of a semiconductor substrate;

forming a second conductive region that has a second type of conductivity, which is an inverse of the first type of conductivity, inside the first conductive region with the second conductive region being exposed to the first surface;

forming an insulating film at or near the first conductive region;

forming a support that projects from the first surface at or near a boundary between the first conductive region and the second conductive region, forming a layer of an adhesive at or near a boundary of the first conductive region and the second conductive region;

mounting a predetermined glass on the layer of adhesive applying a conductive material onto the first conductive region and the second conductive region of the semiconductor device with a greater thickness than the support; and performing a reflow process, with an electrode terminal having been mounted on the conductive material so as to electrically connect the first and second conductive regions with the electrode terminal.

24. A method of manufacturing a semiconductor device, comprising the following steps in the stated order:

forming a first conductive region that has a first type of conductivity, with the first conductive region being exposed to a first surface of a semiconductor substrate;

forming a second conductive region that has a second type of conductivity, which is an inverse of the first type of conductivity, inside the first conductive region with the second conductive region being exposed to the first surface;

forming a support that projects from the first surface at or near a boundary between the first conductive region and the second conductive region;

forming a thick insulating film on the first surface;

etching so as to leave predetermined parts of the thick insulating film and form a thick insulating film at or near an edge of the first conductive region and at or near the boundary between the first conductive region and the second conductive region;

etching on the thick insulating film at or near the edge of the first conductive region so as to reduce a thickness of the thick insulating film and produce an insulating film while not etching the thick insulating film at or near the boundary of the first conductive region and the second conductive region to make the support thicker than the insulating film;

applying a conductive material onto the first conductive region and the second conductive region of the semiconductor device with a greater thickness than the support; and performing a reflow process, with an electrode terminal having been mounted on the conductive material so as to electrically connect the first and second conductive regions with the electrode terminal.

25. A semiconductor device comprising:

a first conductive region of a first type of conductivity that is formed so as to be exposed to a first surface of a semiconductor substrate;

an insulating film provided at or near an edge of the first conductive region;

a second conductive region of a second type of conductivity, which is an inverse of the first type of conductivity, that is formed so as to be exposed to the first surface of the semiconductor substrate;

a conductive material that is provided on the first conductive region and the second conductive region;

an electrode terminal that is provided on the conductive material; and a support that projects from the first surface at a position at or near a boundary between the first conductive region and the second conductive region where the conductive material is provided, wherein the support is formed so that a top end of the support is positioned above a top end of the insulating film but below a top end of the electrically conductive material, and wherein the support has a multilayer structure including a layer of glass material and a film made of the same material as the insulating film.

26. A semiconductor device comprising:

a first conductive region of a first type of conductivity that is formed so as to be exposed to a first surface of a semiconductor substrate;

a second conductive region of a second type of conductivity, which is an inverse of the first type of conductivity, that is formed so as to be exposed to the first surface of the semiconductor substrate;

a conductive material that is provided on the first conductive region and the second conductive region;

an electrode terminal that is provided on the conductive material; and a support that projects from the first surface at a position at or near a boundary between the first conductive region and the second conductive region where the conductive material is provided, wherein the support has a multilayer structure including a layer of glass material and a film made of adhesive.

27. A semiconductor device comprising:

a first conductive region of a first type of conductivity that is formed so as to be exposed to a first surface of a semiconductor substrate;

a second conductive region of a second type of conductivity, which is an inverse of the first type of conductivity, that is formed so as to be exposed to the first surface of the semiconductor substrate;

a conductive material that is provided on the first conductive region and the second conductive region;

an electrode terminal that is provided on the conductive material; and a support that projects from the first surface at a position at or near a boundary between the first conductive region and the second conductive region where the conductive material is provided, and wherein the support is at least 10 µm thick.

28. A power control semiconductor device according to claim 16, wherein the support is at least 10 µm thick.

* * * * *